United States Patent
Lee et al.

(10) Patent No.: US 11,824,100 B2
(45) Date of Patent: Nov. 21, 2023

(54) GATE STRUCTURE OF SEMICONDUCTOR DEVICE AND METHOD OF FORMING SAME

(71) Applicant: Taiwan Semiconductor Manufacturing Co., Ltd., Hsinchu (TW)

(72) Inventors: Hsin-Yi Lee, Hsinchu (TW); Weng Chang, Hsinchu (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 67 days.

(21) Appl. No.: 17/232,282

(22) Filed: Apr. 16, 2021

(65) Prior Publication Data
US 2022/0238688 A1    Jul. 28, 2022

Related U.S. Application Data

(60) Provisional application No. 63/140,283, filed on Jan. 22, 2021.

(51) Int. Cl.
| | | |
|---|---|---|
| *H01L 29/16* | (2006.01) | |
| *H01L 29/20* | (2006.01) | |
| *H01L 29/49* | (2006.01) | |
| *H01L 21/285* | (2006.01) | |
| *H01L 29/66* | (2006.01) | |
| *H01L 29/40* | (2006.01) | |

(52) U.S. Cl.
CPC .... *H01L 29/4966* (2013.01); *H01L 21/28556* (2013.01); *H01L 29/401* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 2013/0175635 A1 | 7/2013 | Kwon et al. | |
| 2014/0353719 A1 | 12/2014 | Kim | |
| 2015/0147876 A1 | 5/2015 | Ando et al. | |
| 2016/0064225 A1* | 3/2016 | Kim | H01L 21/28079 438/591 |
| 2016/0322473 A1* | 11/2016 | JangJian | H01L 29/66795 |
| 2018/0122701 A1* | 5/2018 | Li | H01L 29/20 |

(Continued)

FOREIGN PATENT DOCUMENTS

| | | |
|---|---|---|
| CN | 103545183 A | 1/2014 |
| KR | 20140141258 A | 12/2014 |

(Continued)

*Primary Examiner* — Joseph C. Nicely
*Assistant Examiner* — Lamont B Koo
(74) *Attorney, Agent, or Firm* — Slater Matsil, LLP

(57) ABSTRACT

A semiconductor device and a method of forming the same are provided. The semiconductor device includes a gate stack over an active region of a substrate. The gate stack includes a gate dielectric layer and a first work function layer over the gate dielectric layer. The first work function layer includes a plurality of first layers and a plurality of second layers arranged in an alternating manner over the gate dielectric layer. The plurality of first layers include a first material. The plurality of second layers include a second material different from the first material.

20 Claims, 17 Drawing Sheets

(56) References Cited

U.S. PATENT DOCUMENTS

2018/0166287 A1* 6/2018 Wu .................. H01L 29/41766
2018/0226300 A1    8/2018 Song et al.
2019/0378907 A1   12/2019 Wang et al.

FOREIGN PATENT DOCUMENTS

KR    20160026486 A    3/2016
KR    20180091245 A    8/2018
TW      201324596 A    6/2013

* cited by examiner

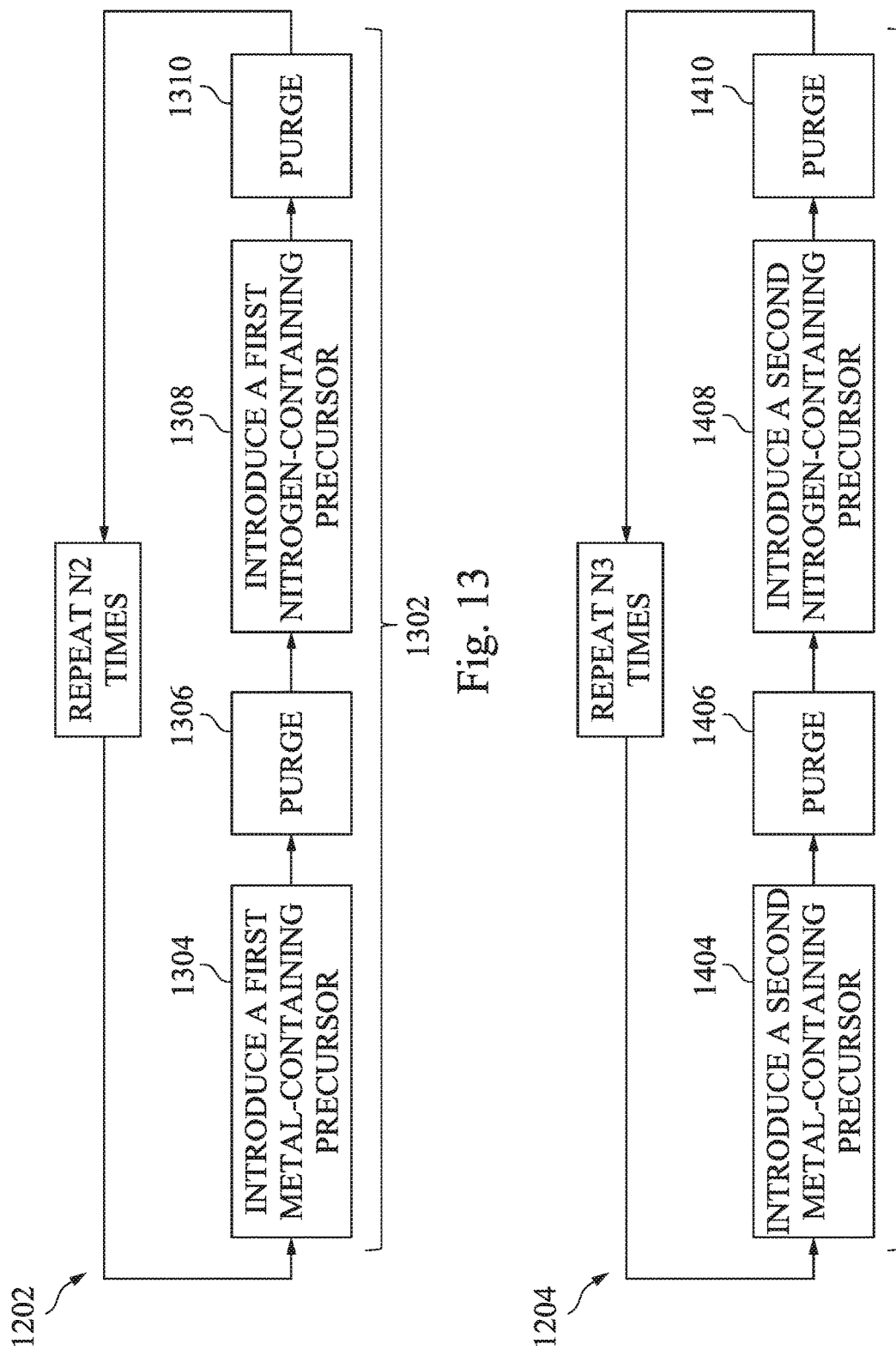

GATE STRUCTURE OF SEMICONDUCTOR DEVICE AND METHOD OF FORMING SAME

PRIORITY CLAIM AND CROSS-REFERENCE

This application claims the benefit of U.S. Provisional Application No. 63/140,283, filed on Jan. 22, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 13 is a flow diagram illustrating an atomic layer deposition process in accordance with some embodiments.

FIG. 14 is a flow diagram illustrating an atomic layer deposition process in accordance with some embodiments.

DETAILED DESCRIPTION

Figure 1:
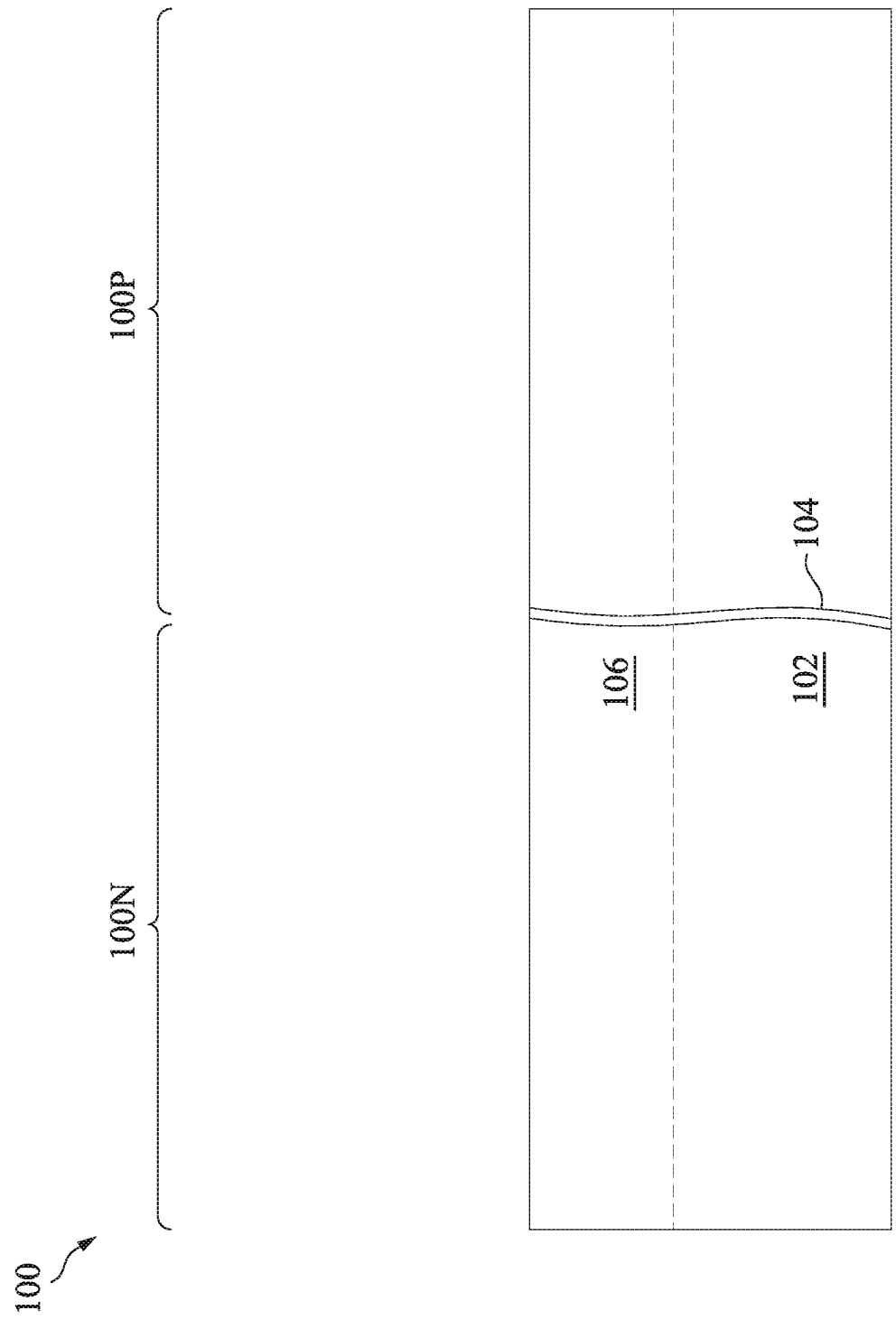
FIGS. 1-11 and 15-18 are cross-sectional views of intermediate stages in the manufacturing of a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a gate structure of a semiconductor device and a method of forming the same. Various embodiments presented herein are discussed in the context of a planar filed-effect transistor (FET) device formed using a gate-last process. In other embodiments, a gate-first process may be used. Various embodiments may be applied, however, to dies comprising other types of transistors (e.g., FinFETs, gate-all-around (GAA) transistors, or the like) in lieu of or in combination with the planar FETs. Various embodiments discussed herein allow for forming a gate structure comprising a work function layer, a work function of which can be tuned according to design requirements of a semiconductor device. In some embodiments, the work function layer comprises two different metal nitride materials (such as a nitride of a first metal and a nitride a second metal different from the first metal) arranged in a plurality of alternating layers. The work function of the work function layer may be tuned by adjusting a ratio of a fraction of the first metal to a fraction of the second metal within the work function layer.

FIGS. 1-11 and 15-18 are cross-sectional views of intermediate stages in the manufacturing of a semiconductor device 100 in accordance with some embodiments. In FIG. 1, a substrate 102 is provided. The substrate 102 may be a semiconductor substrate, such as a bulk semiconductor, a semiconductor-on-insulator (SOI) substrate, or the like, which may be doped (e.g., with a p-type or an n-type dopant) or undoped. The substrate 102 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 102 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 102 has a region 100N and a region 100P. The region 100N can be for forming n-type devices, such as n-type transistors. The region 100P can be for forming p-type devices, such as p-type transistors. The region 100N may be physically separated from the region 100P (as illustrated by a divider 104), and any number of device features (e.g., other active devices, doped regions, isolation structures, etc.) may be disposed between the region 100N and the region 100P.

The substrate 102 comprises an active region 106. In some embodiments when the semiconductor device 100 is a planar FET device, the active region 106 comprises an upper planar portion of the substrate 102. In other embodiments when the semiconductor device 100 is a planar FET device, the active region 106 is a semiconductor layer formed over the substrate 102, such that the semiconductor layer and the substrate 102 comprise different semiconductor materials. In some embodiments when the semiconductor device 100 is a FinFET device, the active region 106 comprises one or more semiconductor strips. The semiconductor strips may be also referred to as fins. In some embodiments, the semiconductor strips and the substrate 102 comprise a same semiconductor material. In other embodiments, the semiconductor strips and the substrate 102 comprise different semiconductor materials. In some embodiments when the semiconductor device 100 is a GAA device, the active region 106 comprises one or more nanostructures. The nanostructures may comprise nanosheets, nanowires, or the like. In some embodiments, the nanostructures and the substrate 102 comprise a same semiconductor material. In other embodiments, the nanostructures and the substrate 102 comprise different semiconductor materials.

Figure 2:
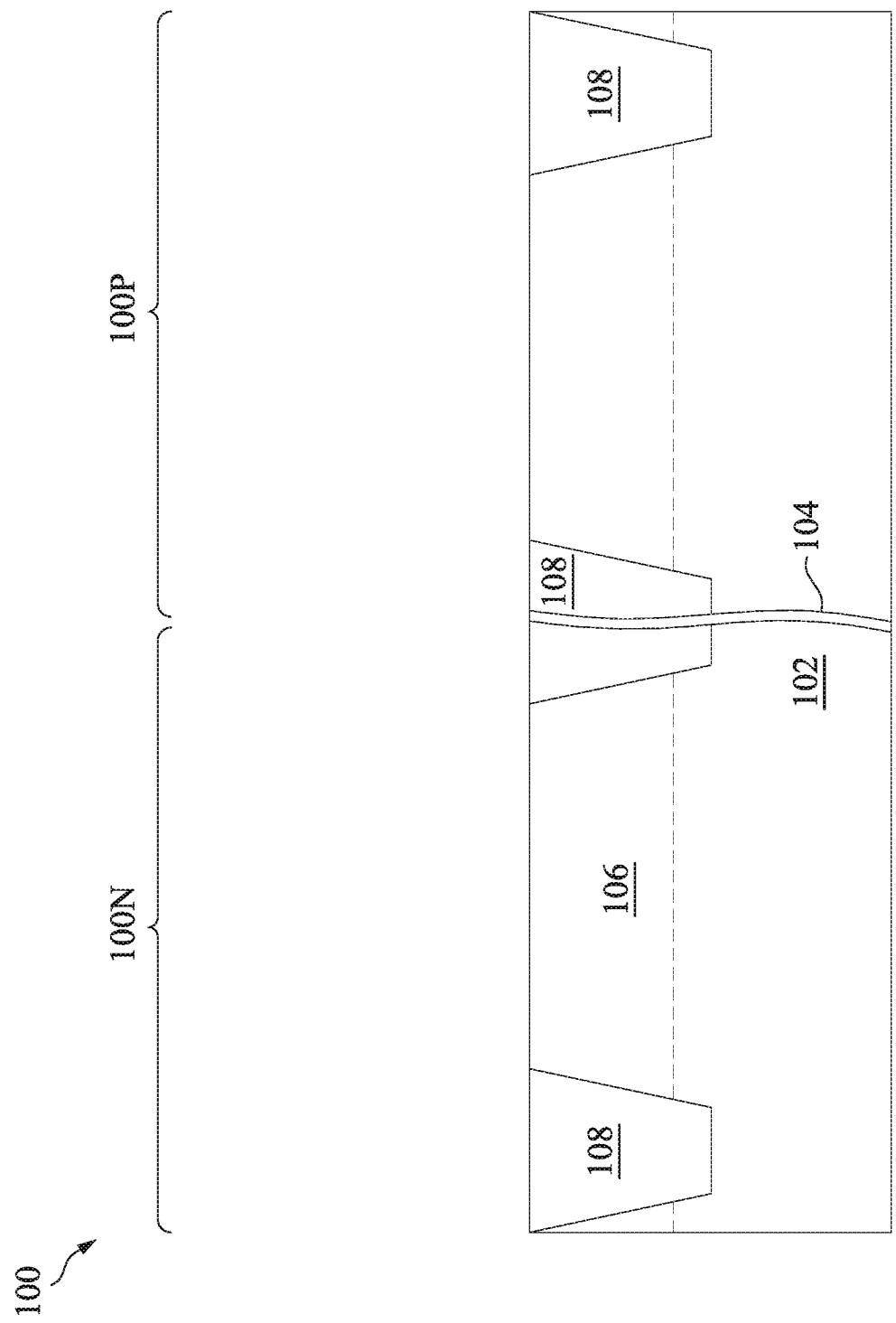

In FIG. 2, isolation regions 108 are formed in the substrate 102. In some embodiments, process steps for forming the isolation regions 108 include forming a plurality of recesses in the substrate 102 and depositing an insulation material in the recesses and over the substrate 102. The recesses may be formed by patterning the substrate 102 using suitable photolithography and etch processes. The etch process may comprise, for example, a dry etch process. The etch process may be anisotropic.

The insulation material may be an oxide, such as silicon oxide, a nitride, a combination thereof, or the like, and may be formed by a high density plasma chemical vapor deposition (HDP-CVD), a flowable CVD (FCVD) (e.g., a CVD-based material deposition in a remote plasma system and post curing to make it convert to another material, such as an oxide), a combination thereof, or the like. Other insulation materials formed by any acceptable process may be used. In the illustrated embodiment, the insulation material is silicon oxide formed by a FCVD process. An anneal process may be performed once the insulation material is formed. Although the insulation material is illustrated as a single layer, some embodiments may utilize multiple layers. For example, in some embodiments, a liner (not shown) may first be formed along sidewalls and bottoms of the recesses and over the active region 106 of the substrate 102. Thereafter, a fill material, such as those discussed above may be formed over the liner.

In some embodiments, a removal process is applied to the insulation material to remove excess portions of the insulation material overfilling the recesses. Remaining portions of the insulation material form the isolation regions 108. In some embodiments, a planarization process, such as a chemical mechanical polish (CMP) process, an etch-back process, a combination thereof, or the like, may be utilized. The planarization process exposes a top surface of the active region 106 of the substrate 102, such that the top surface of the active region 106 and the top surfaces of the isolation regions 108 are substantially co-planar or level (within process variations of the planarization process) after the planarization process is completed.

Further in FIG. 2, appropriate wells (not shown) may be formed in the active region 106 of the substrate 102. In some embodiments, a P well may be formed in the region 100N, and an N well may be formed in the region 100P. In some embodiments, a P well or an N well are formed in both the region 100N and the region 100P. In the embodiments with different well types, the different implant steps for the region 100N and the region 100P may be achieved using a photoresist or other masks (not shown). For example, a first photoresist may be formed over the active region 106 of the substrate 102 and the isolation regions 108 in both the region 100N and the region 100P. The first photoresist is patterned to expose the region 100P. The first photoresist can be formed by using a spin-on technique and can be patterned using acceptable photolithography techniques. Once the first photoresist is patterned, an n-type impurity implantation is performed in the region 100P, while the remaining portion of the first photoresist acts as a mask to substantially prevent n-type impurities from being implanted into the region 100N. The n-type impurities may be phosphorus, arsenic, antimony, a combination thereof, or the like. After the implantation, the first photoresist is removed by an acceptable ashing process followed by a wet clean process, for example.

Following the implantation of the region 100P, a second photoresist is formed over the active region 106 of the substrate 102 and the isolation regions 108 in both the region 100P and the region 100N. The second photoresist is patterned to expose the region 100N. The second photoresist can be formed by using a spin-on technique and can be patterned using acceptable photolithography techniques. Once the second photoresist is patterned, a p-type impurity implantation may be performed in the region 100N, while the remaining portion of the second photoresist acts as a mask to substantially prevent p-type impurities from being implanted into the region 100P. The p-type impurities may be boron, $BF_2$, indium, a combination thereof, or the like. After the implantation, the second photoresist may be removed by an acceptable ashing process followed by a wet clean process, for example. After performing the implantations of the region 100N and the region 100P, an anneal process may be performed to activate the p-type and/or n-type impurities that were implanted.

Figure 3:
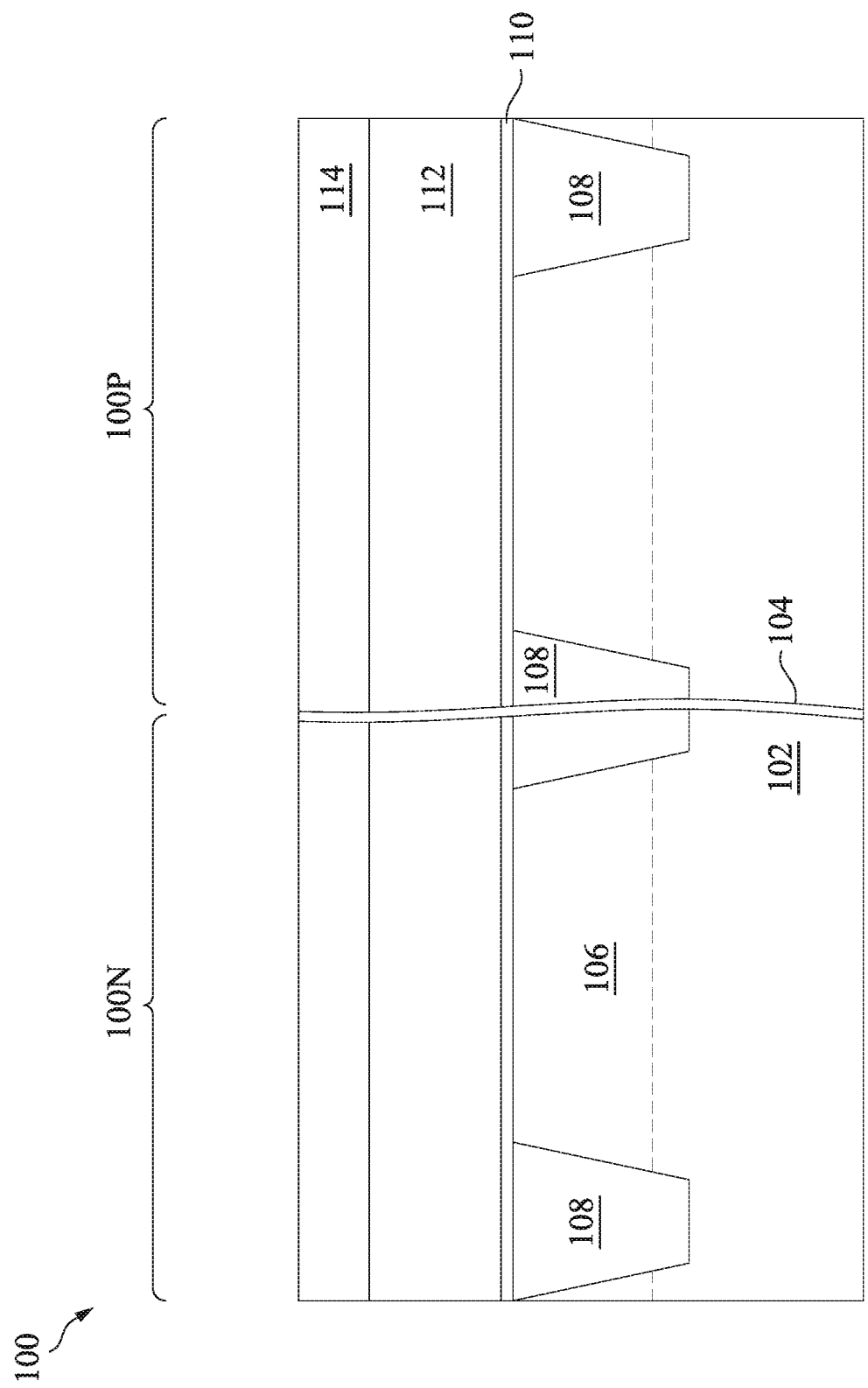

In FIG. 3, a dummy dielectric layer 110 is formed over the active region 106 of the substrate 102 and the isolation regions 108. The dummy dielectric layer 110 may be, for example, silicon oxide, silicon nitride, a combination thereof, or the like, and may be deposited or thermally grown according to acceptable techniques. A dummy gate layer 112 is formed over the dummy dielectric layer 110, and a mask layer 114 is formed over the dummy gate layer 112. The dummy gate layer 112 may be deposited over the dummy dielectric layer 110 and then planarized using, for example, a CMP process. The mask layer 114 may be deposited over the dummy gate layer 112. The dummy gate layer 112 may be a conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 112 may be deposited by physical vapor deposition (PVD), CVD, sputter deposition, or other techniques known and used in the art for depositing conductive materials. The dummy gate layer 112 may be made of other materials that have a higher etching selectivity than materials of the isolation regions 108. The mask layer 114 may include, for example, one or more layers of silicon oxide, SiN, SiON, a combination thereof, or the like. In some embodiments, the mask layer 114 may comprise a layer of silicon nitride and a layer of silicon oxide over the layer of silicon nitride. In some embodiments, a single dummy dielectric layer 110, a single dummy gate layer 112, and a single mask layer 114 are formed across both the region 100N and the region 100P. In other embodiments, a first dummy dielectric layer, a first dummy gate layer, and a first mask layer are formed in the region 100N and a second dummy dielectric layer, a second dummy gate layer, and a second mask layer are formed in the region 100P, such that the first dummy dielectric layer and the second dummy dielectric layer comprise different materials, the first dummy gate layer and the second dummy gate layer comprise different materials, and the first mask layer and the second mask layer comprise different materials.

Figure 4:
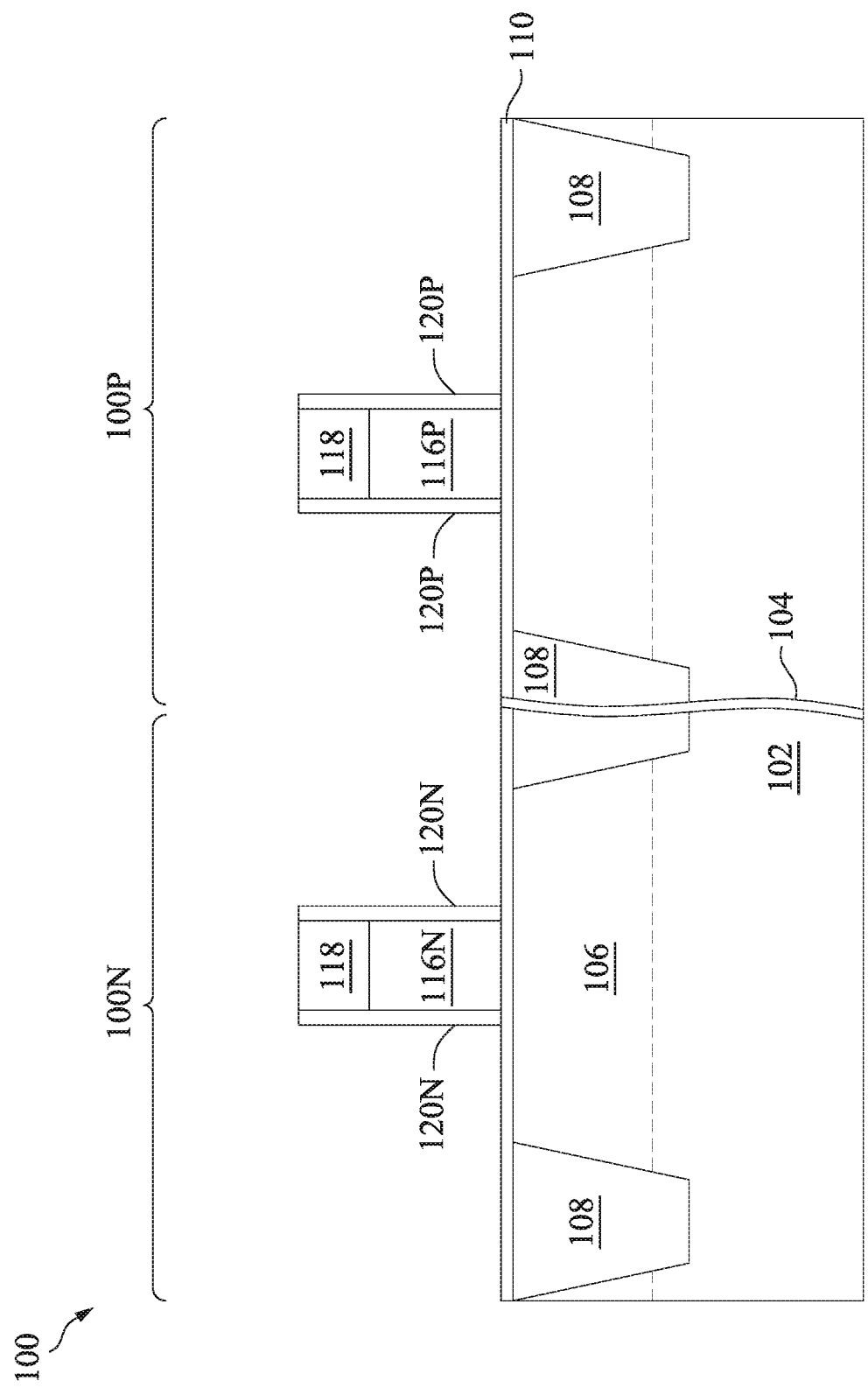

In FIG. 4, the mask layer 114 (see FIG. 3) may be patterned using acceptable photolithography and etch techniques to form masks 118. In some embodiments, the etch techniques may include one or more anisotropic etch processes such as a reactive ion etch (RIE), neutral beam etch (NBE), a combination thereof, or the like. Subsequently, the pattern of the masks 118 may be transferred to the dummy gate layer 112 (see FIG. 3) to form dummy gates 116N in the region 100N and dummy gates 116P in the region 100P. In some embodiments, the pattern of the masks 118 may also be transferred to the dummy dielectric layer 110 by an acceptable etch technique. As described below in greater detail, the dummy gates 116N and 116P are sacrificial gates and are subsequently replaced by replacement gates. Accordingly, dummy gates 116N and 116P may also be referred to as sacrificial gates. In other embodiments, some of the dummy gates 116N and 116P are not replaced and remain in the final structure of the semiconductor device 100.

Further in FIG. 4, gate seal spacers 120N may be formed on exposed surfaces of the dummy gates 116N and the respective masks 118, and gate seal spacers 120P may be formed on exposed surfaces of the dummy gates 116P and the respective masks 118. A thermal oxidation or a deposition followed by an anisotropic etch may form the gate seal spacers 120N and 120P. The gate seal spacers 120N and 120P may comprise silicon oxide, silicon nitride, SiCN, SiOC, SiOCN, a combination thereof, or the like. In some embodiments, the gate seal spacers 120N and the gate seal spacers 120P comprise a same material. In other embodiments, the gate seal spacers 120N and the gate seal spacers 120P comprise different materials. In some embodiments, the gate seal spacers 120N and the gate seal spacers 120P have a same width. In other embodiments, the gate seal spacers 120N and the gate seal spacers 120P have different widths.

After the formation of the gate seal spacers 120N and 120P, implants for lightly doped source/drain (LDD) regions (not explicitly illustrated) may be performed. In the embodiments with different device types, similar to the implants discussed above in FIG. 2, a mask, such as a photoresist, may be formed over the region 100N, while exposing the region 100P, and appropriate type (e.g., p-type) impurities may be implanted into the active region 106 of the substrate 102 in the region 100P. The mask may then be removed. Subsequently, a mask, such as a photoresist, may be formed over the region 100P, while exposing the region 100N, and appropriate type impurities (e.g., n-type) may be implanted into the active region 106 of the substrate 102 in the region 100N. The mask may then be removed. The n-type impurities may be the any of the n-type impurities previously discussed, and the p-type impurities may be the any of the p-type impurities previously discussed. An anneal may be used to activate the implanted impurities.

Figure 5:
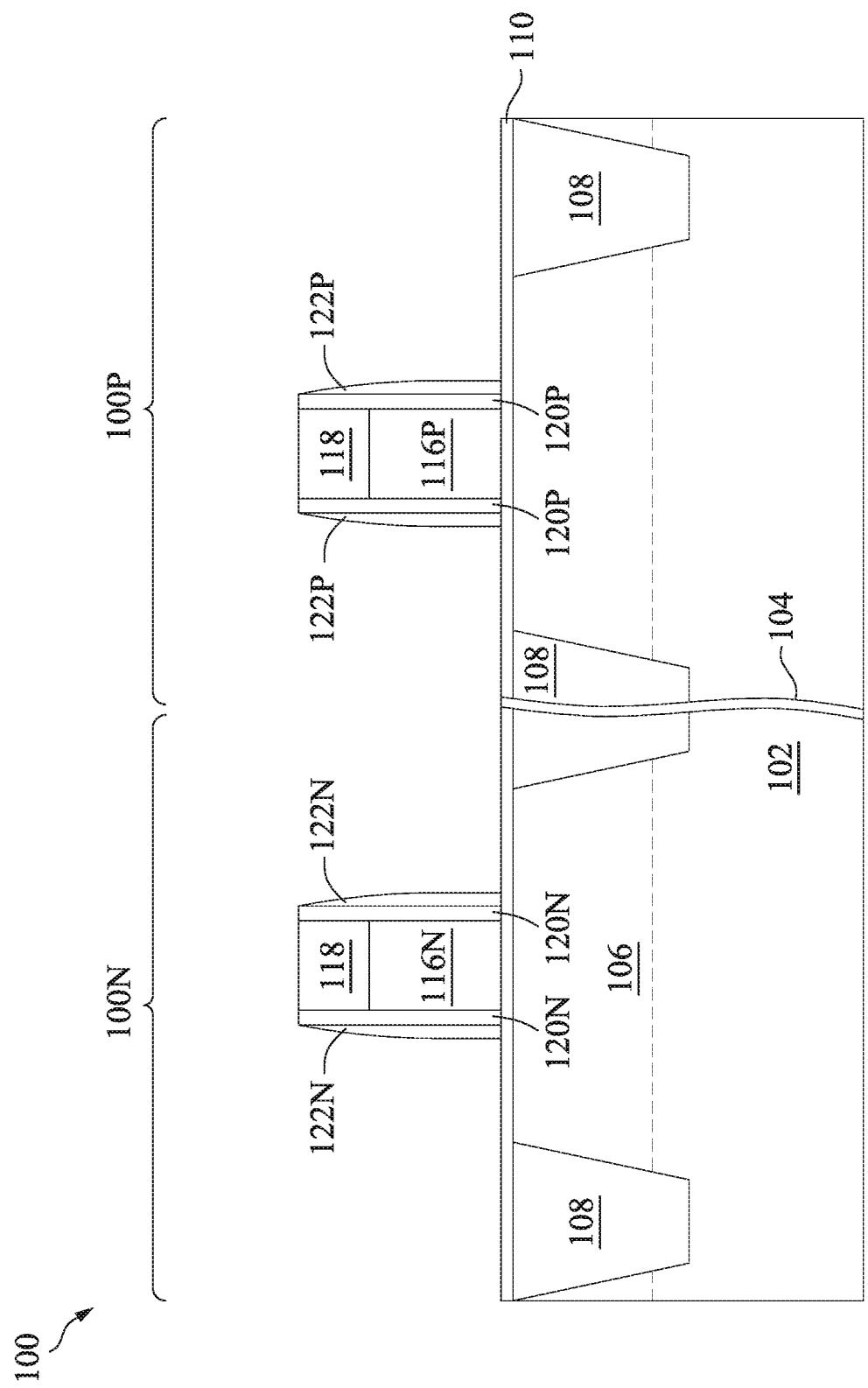

In FIG. 5, gate spacers 122N are formed on the gate seal spacers 120N along sidewalls of the dummy gates 116N and the masks 118 in the region 100N, and gate spacers 122P are formed on the gate seal spacers 120P along sidewalls of the dummy gates 116P and the masks 118 in the region 100P. The gate spacers 122N and 122P may be formed by blanket or conformally depositing an insulating material and subsequently anisotropically etching the insulating material. The insulating material of the gate spacers 122N and 122P may comprise silicon oxide, silicon nitride, SiCN, SiOC, SiOCN, a combination thereof, or the like. In some embodiments, each of the gate spacers 122N and 122P may comprise a plurality of layers (not shown), such that the layers comprise different materials. In some embodiments, the gate spacers 122N and the gate spacers 122P comprise a same material. In other embodiments, the gate spacers 122N and the gate spacers 122P comprise different materials. In some embodiments, the gate spacers 122N and the gate spacers 122P have a same width. In other embodiments, the gate spacers 122N and the gate spacers 122P have different widths.

It is noted that the above disclosure generally describes a process of forming spacers and LDD regions. Other processes and sequences may be used. For example, fewer or additional spacers may be utilized, different sequence of steps may be utilized (e.g., the gate seal spacers 120N and 120P may not be etched prior to forming the gate spacers 122N and 120P, respectively, yielding "L-shaped" gate seal spacers, spacers may be formed and removed, and/or the like). Furthermore, the n-type and p-type devices may be formed using a different structures and steps. For example, LDD regions for n-type devices in the region 100N may be formed prior to forming the gate seal spacers 120N, while the LDD regions for p-type devices in the region 100P may be formed after forming the gate seal spacers 120P.

Figure 6:
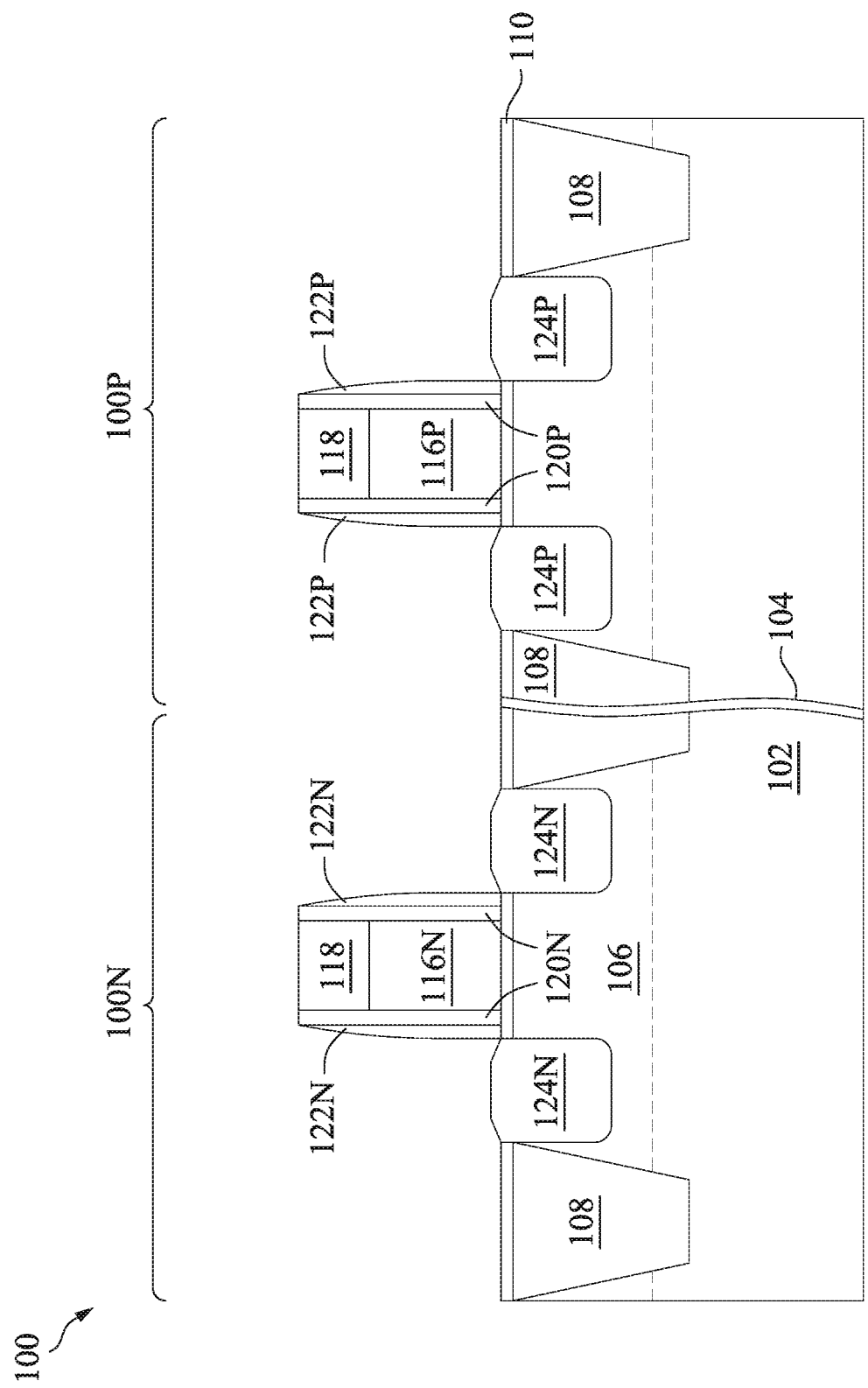

In FIG. 6, epitaxial source/drain regions 124N and 124P are formed in the active regions 106 of the region 100N and the region 100P, respectively, to exert stress in respective channel regions, thereby improving device performance. Each dummy gate 116N is disposed between respective neighboring pairs of the epitaxial source/drain regions 124N. Each dummy gate 116P is disposed between respective neighboring pairs of the epitaxial source/drain regions 124P. The gate spacers 122N are used to separate the epitaxial source/drain regions 124N from the dummy gates 116N by an appropriate lateral distance so that the epitaxial source/drain regions 124N do not short out subsequently formed gates of the semiconductor device 100. The gate spacers 122P are used to separate the epitaxial source/drain regions 124P from the dummy gates 116P by an appropriate lateral distance so that the epitaxial source/drain regions 124P do not short out subsequently formed gates of the semiconductor device 100.

The epitaxial source/drain regions 124N in the region 100N may be formed by masking the region 100P and etching the active region 106 to form recesses in the active region 106. Then, the epitaxial source/drain regions 124N are epitaxially grown in the recesses. The epitaxial source/drain regions 124N may include any acceptable material, such as appropriate for n-type devices. For example, if the active region 106 comprises silicon, the epitaxial source/drain regions 124N may include materials exerting a tensile strain in the channel region, such as silicon, SiC, SiCP, SiP, a combination thereof, or the like. The epitaxial source/drain regions 124N may have facets.

The epitaxial source/drain regions 124P in the region 100P may be formed by masking the region 100N and etching the active region 106 to form recesses in the active region 106. Then, the epitaxial source/drain regions 124P are epitaxially grown in the recesses. The epitaxial source/drain regions 124P may include any acceptable material, such as appropriate for p-type devices. For example, if the active region 106 comprises silicon, the epitaxial source/drain regions 124P may comprise materials exerting a compressive strain in the channel region, such as SiGe, SiGeB, Ge, GeSn, a combination thereof, or the like. The epitaxial source/drain regions 124P may have facets.

The epitaxial source/drain regions 124N and 124P may be implanted with n-type and p-type dopants, respectively, to form source/drain regions, similar to the process previously discussed for forming lightly-doped source/drain regions, followed by an anneal. The n-type and p-type impurities for the epitaxial source/drain regions 124N and 124P, respectively, may be any of the impurities previously discussed. In some embodiments, the epitaxial source/drain regions 124N and 124P may be in situ doped during growth.

Figure 7:
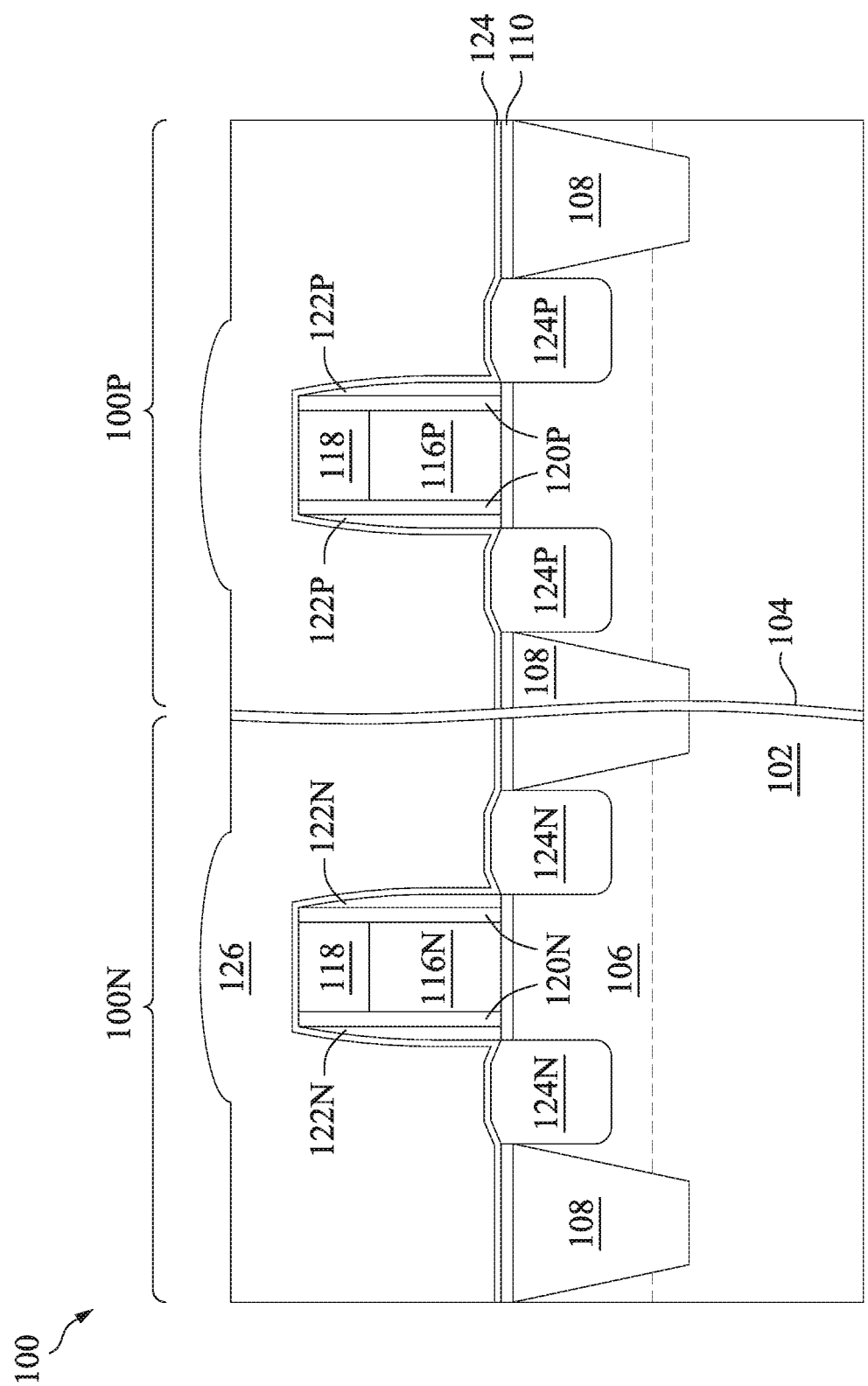

In FIG. 7, an inter-layer dielectric (ILD) 126 is deposited over the structure illustrated in FIG. 6. The ILD 126 may be formed of a dielectric material, and may be deposited by any suitable method, such as CVD, plasma-enhanced CVD (PECVD), FCVD, a combination thereof, or the like. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be also used. In some embodiments, a contact etch stop layer (CESL) 124 is disposed between the ILD 126 and the epitaxial source/drain regions 124N and 124P, the masks 118, the gate spacers 122N and 122P, and the isolation regions 108. The CESL 124 may comprise a dielectric material, such as, silicon nitride, silicon oxide, silicon oxynitride, a combination thereof, or the like, having a different etch rate than the material of the overlying ILD 126.

Figure 8:
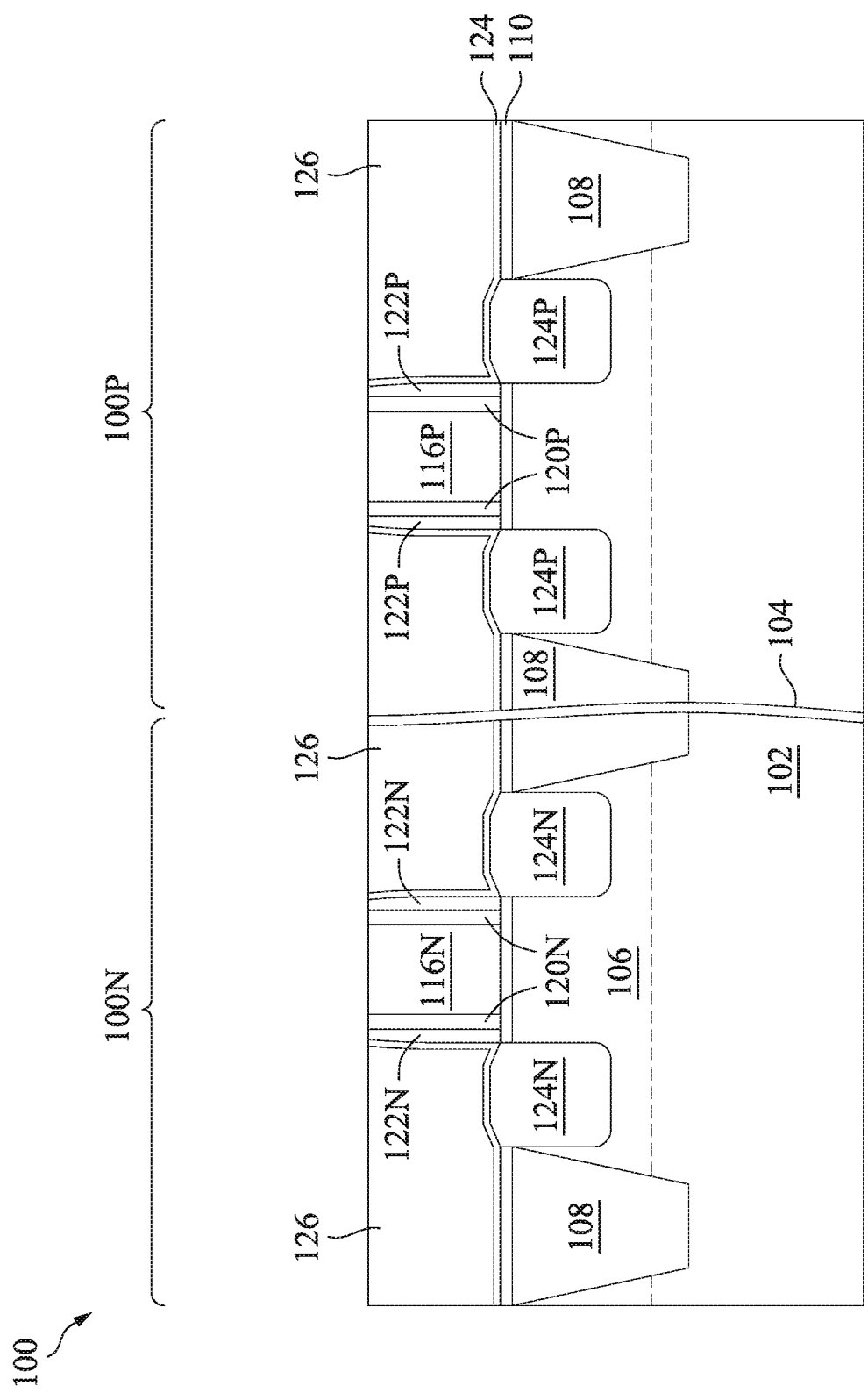

In FIG. 8, a planarization process, such as a CMP process, may be performed to level the top surface of the ILD 126 with the top surfaces of the dummy gates 116N and 116P, or the masks 118 (see FIG. 7). In some embodiments, the planarization process may also remove the masks 118 on the dummy gates 116N and 116P, and portions of the gate seal spacers 120N and 120P, and the gate spacers 122N and 122P along sidewalls of the masks 118. After the planarization process, top surfaces of the dummy gates 116N and 116P, top surfaces of the gate seal spacers 120N and 120P, top surfaces of the gate spacers 122N and 122P, and a top surface of the ILD 126 are substantially co-planar or level with each other within process variations of the planarization process. Accordingly, the top surfaces of the dummy gates 116N and 116P are exposed through the ILD 126. In some embodiments, the masks 118 may remain, in which case the planarization process levels the top surface of the ILD 126 with top surfaces of the masks 118.

Figure 9:
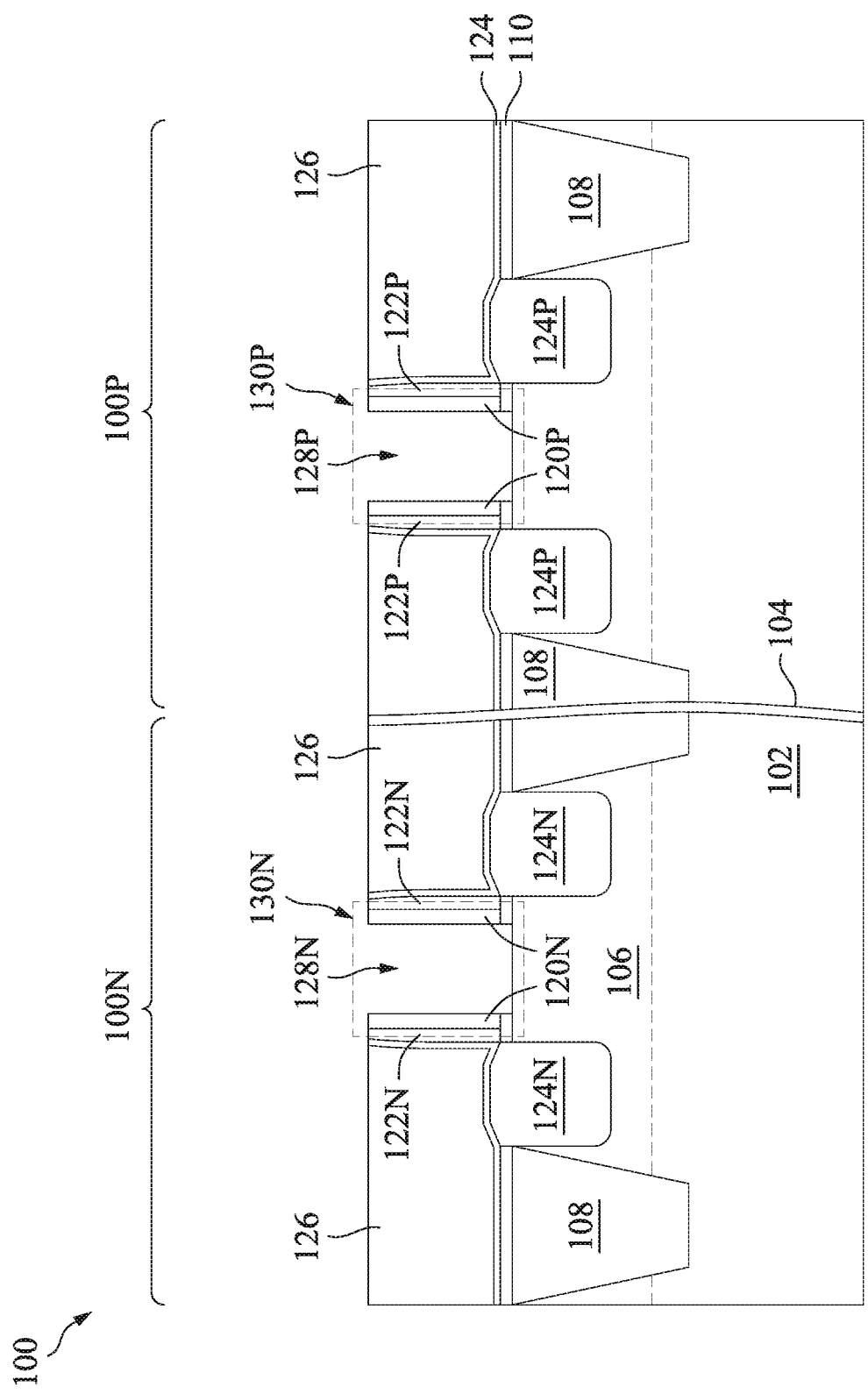

In FIG. 9, the dummy gates 116N and 116P (see FIG. 8), and the masks 118 (see FIG. 7), if present, are removed in an etching step(s), so that openings 128N and 128P are formed in the regions 100N and 100P, respectively. In some embodiments, portions of the dummy dielectric layer 110 in the openings 128N and 128P may also be removed. In other embodiments, only the dummy gates 116N and 116P are removed and the dummy dielectric layer 110 remains and is exposed by the openings 128N and 128P. In some embodiments, the dummy dielectric layer 110 is removed from the openings 128N and 128P in a first region of a die (e.g., a core logic region) and remains in openings 128N and 128P in a second region of the die (e.g., an input/output region).

In some embodiments, the dummy gates 116N and 116P are removed by a suitable etch process. For example, the etch process may include a dry etch process using reaction gas(es) that selectively etch the dummy gates 116N and 116P without etching the ILD 126, the CESL 124, the gate seal spacers 120N and 120P, and the gate spacers 122N and 122P. Each of the openings 128N and 128P exposes a channel region of the respective active region 106. During the removal, the dummy dielectric layer 110 may be used as an etch stop layer when the dummy gates 116N and 116P are etched. The dummy dielectric layer 110 may then be optionally removed after the removal of the dummy gates 116N and 116P.

Figure 10:
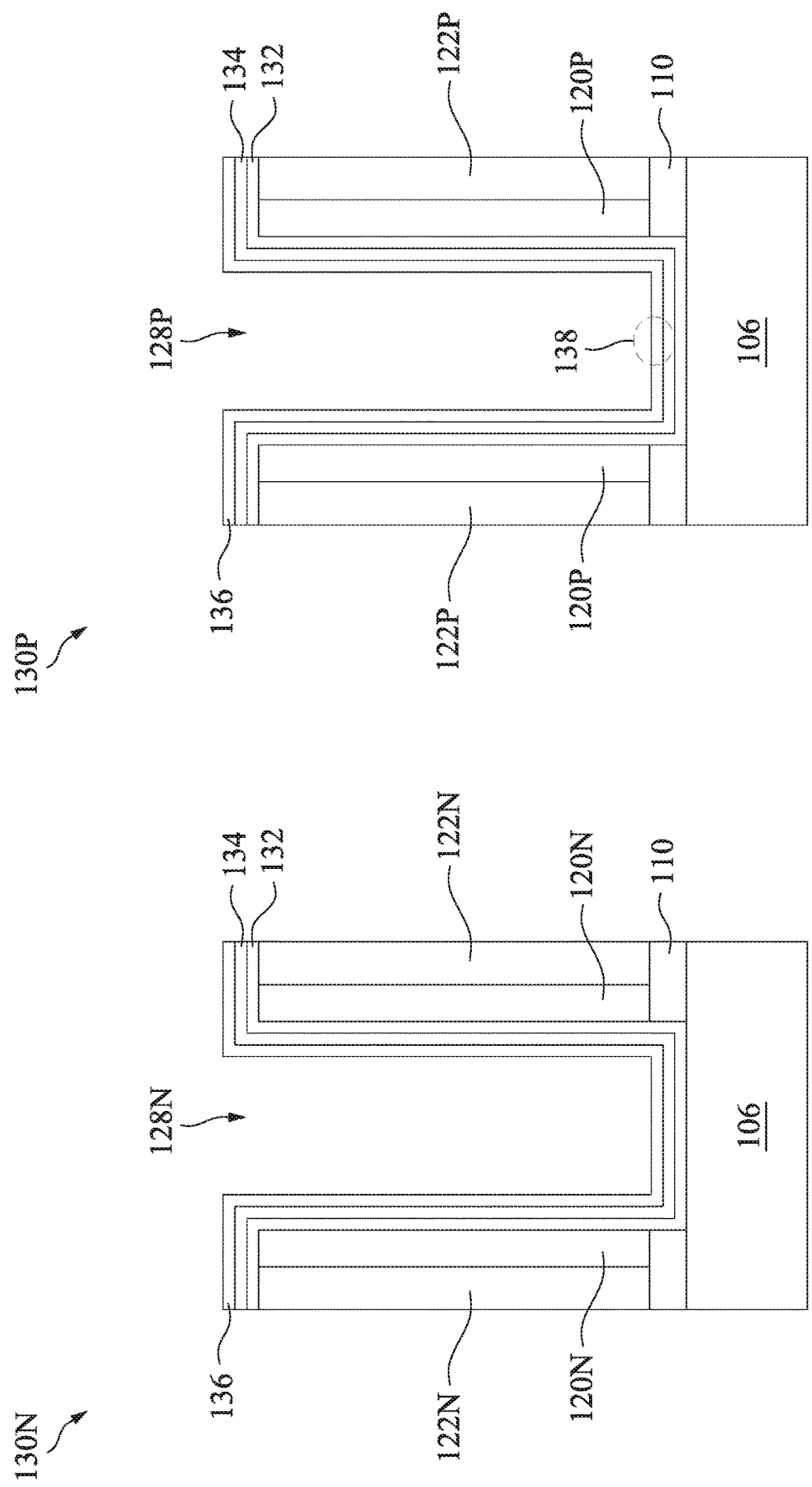

FIGS. 10, 11, and 15-17 are cross-sectional views of intermediate stages in the manufacturing of gate stacks 146N and 146P (see FIG. 17) in the openings 128N and 128P (see FIG. 9) in accordance with some embodiments. FIGS. 10, 11, and 15-17 illustrate magnified views of the regions 130N and 130P shown in FIG. 9 for clarity of presentation. In FIG. 10, an interfacial layer 132 is formed in the openings 128N and 128P. The interfacial layer 132 may comprise silicon oxide and may be formed using a chemical deposition process, such as atomic layer deposition (ALD), CVD, or the like, or using an oxidation process. In some embodiments when the interfacial layer 132 is formed using a deposition process, the interfacial layer 132 extends along exposed surfaces of the active regions 106, the dummy dielectric layer 110, and the gate seal spacers 120N and 120P. In some embodiments when the interfacial layers 132 are formed using an oxidation process, the interfacial layer 132 extends along exposed surfaces of the active regions 106, and does not extend along exposed surfaces of the dummy dielectric layer 110, and the gate seal spacers 120N and 120P. In some embodiments, the interfacial layer 132 has a thickness between about 5 Å and about 25 Å.

After forming the interfacial layer 132, a gate dielectric layer 134 is formed over the interfacial layer 132 in the openings 128N and 128P. In some embodiments, the gate dielectric layer 134 may comprise silicon oxide, silicon nitride, multilayers thereof, or the like. In some embodiments, the gate dielectric layer 134 may include a high-k dielectric material, and in these embodiments, the gate dielectric layer 134 may have a k value greater than about 7.0, and may include a metal oxide or a silicate of hafnium, aluminum, zirconium, lanthanum, manganese, barium, titanium, lead, and combinations thereof, or the like. In some embodiments, the gate dielectric layer 134 may be formed using ALD, CVD, a combination thereof, or the like. In some embodiments, the gate dielectric layer 134 has a thickness between about 5 Å and about 35 Å.

Figure 11:
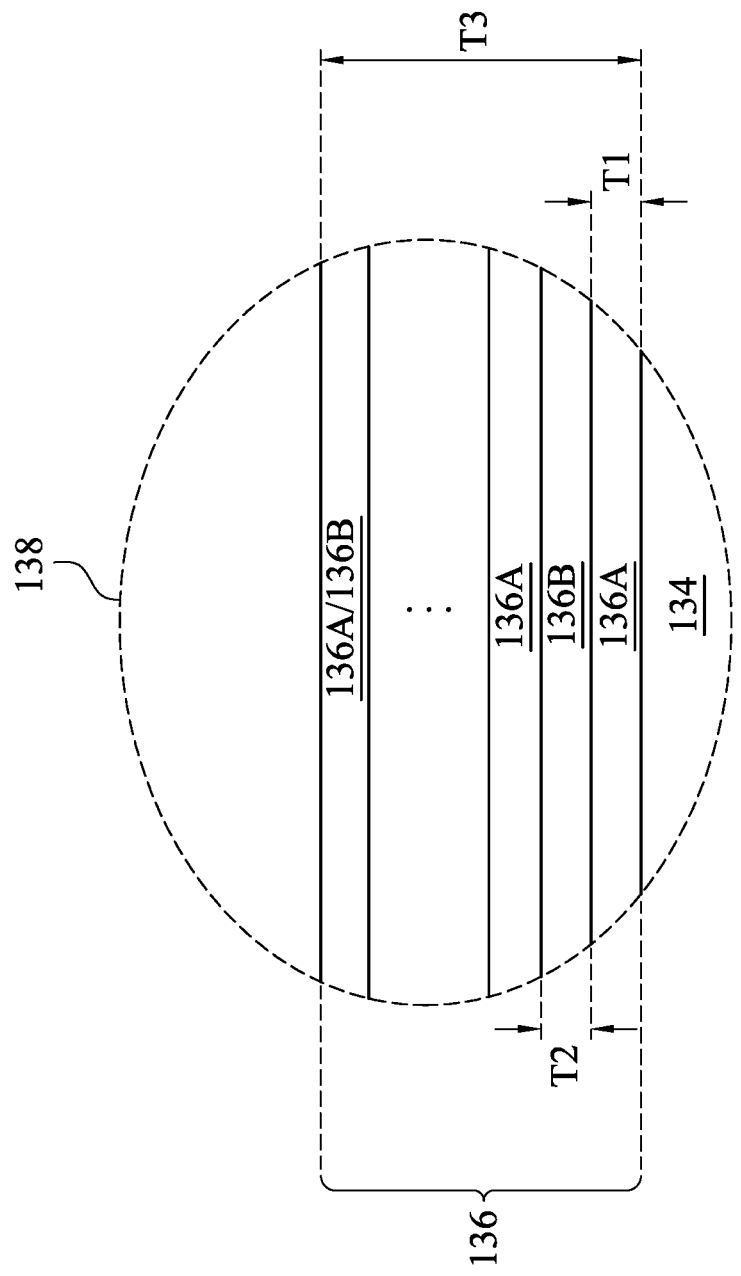

Further in FIG. 10, a work function layer 136 is formed over the gate dielectric layer 134 in the openings 128N and 128P. The work function layer 136 may be also referred to as a p-type work function layer. In some embodiments, the work function layer 136 comprises a plurality of layers 136A and 136B as shown in FIG. 11, which illustrates a magnified portion of a region 138 shown in FIG. 10. In some embodiments, the work function layer 136 comprises a plurality of first layers 136A and a plurality of second layers 136B that are arranged in alternating manner. In some embodiments, a topmost layer of the plurality of first layers 136A is a topmost layer of the work function layer 136. In other embodiments, a topmost layer of the plurality of second layers 136B is the topmost layer of the work function layer 136.

In some embodiments, the plurality of first layers 136A comprise TiN and the plurality of second layers 136B comprise TaN. In other embodiments, the plurality of first layers 136A comprise TaN and the plurality of second layers 136B comprise TiN. In some embodiments, the plurality of first layers 136A have a same width. In other embodiments, the plurality of first layers 136A have different widths. In some embodiments, the plurality of second layers 136B have a same width. In other embodiments, the plurality of second layers 136B have different widths. In some embodiments, the plurality of first layers 136A comprise between 1 layer and 3 layers. In some embodiments, the plurality of second layers 136B comprise between 1 layer and 3 layers. In some embodiments, the plurality of first layers 136A have a same width as the plurality of second layers 136B. In other embodiments, the plurality of first layers 136A have a width different from the plurality of second layers 136B. In some embodiments, each of the plurality of first layers 136A has a thickness T1 between about 5 Å and about 30 Å. In some embodiments, each of the plurality of second layers 136B has a thickness T2 between about 5 Å and about 30 Å. In some embodiments, a ratio of the thickness T1 to the thickness T2 (T1/T2) is between about 0.3 and about 3. In some embodiments, the work function layer 136 has a thickness T3 between about 5 Å and about 30 Å.

In some embodiments, a fraction of Ti in the work function layer 136 is between about 7 at % to about 40 at %. In some embodiments, a fraction of Ta in the work function layer 136 is between about 7 at % to about 40 at %. In some embodiments, a ratio of the fraction of Ta to the fraction of Ti in the work function layer 136 can be tuned from about 0.5 to about 0.95. In some embodiments, the ratio of the fraction of Ta to the fraction of Ti in the work function layer 136 can be adjusted, for example, by tuning thickness T1 of the plurality of first layers 136A and the thickness T2 of the plurality of second layers 136B. In some embodiments, the ratio of the fraction of Ta to the fraction of Ti in the work function layer 136 can be adjusted, for example, by tuning the fractions of Ti or Ta in the plurality of first layers 136A and by tuning the fractions of Ti or Ta in the plurality of second layers 136B. By tuning the ratio of the fraction of Ta to the fraction of Ti in the work function layer 136, the work function of the work function layer 136 can be adjusted. In some embodiments, a high ratio of the fraction of Ta to the fraction of Ti in the work function layer 136 leads to a low work function. In some embodiments, a low ratio of the fraction of Ta to the fraction of Ti in the work function layer 136 leads to a high work function.

Figure 12:
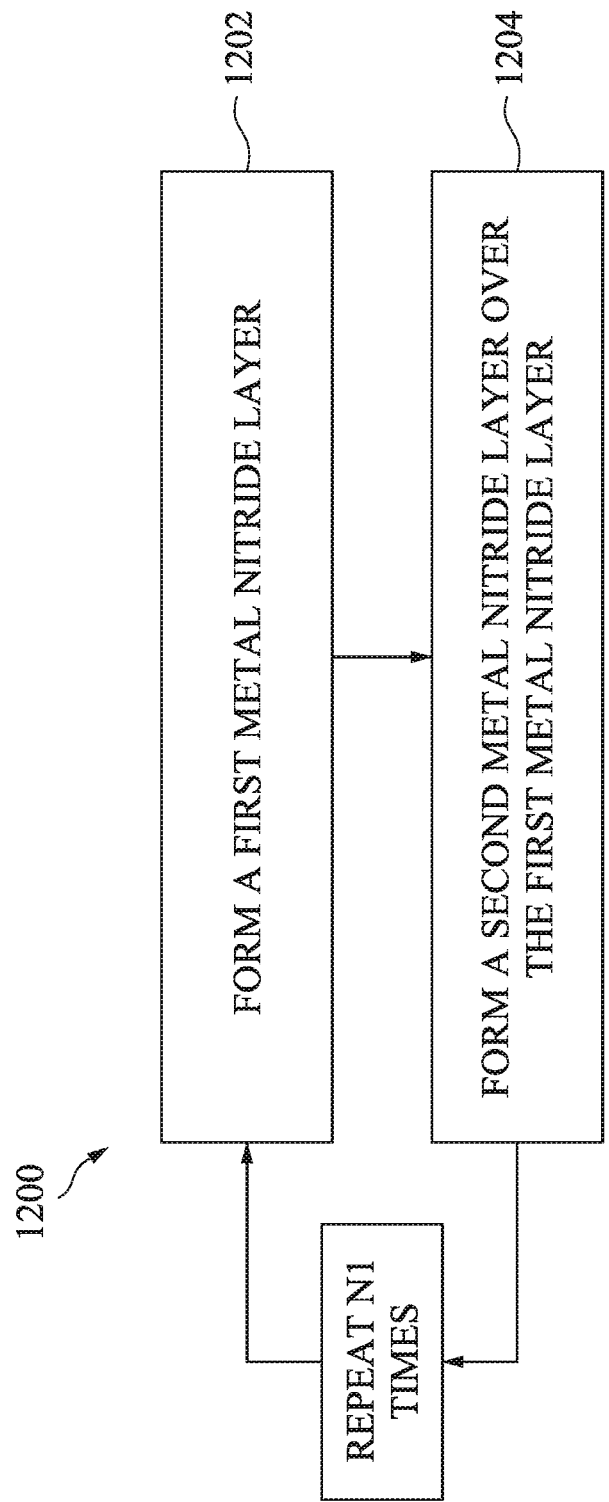
FIG. 12 is a flow diagram illustrating a method of forming a work function layer in accordance with some embodiments.

FIG. 12 is a flow diagram illustrating a method 1200 of forming the work function layer 136 (see FIGS. 10 and 11) in accordance with some embodiments. The method 1200 starts with step 1202, when a first metal nitride layer (such as a first one of the plurality of first layers 136A illustrated in FIG. 11) is formed over the gate dielectric layer 134. In step 1204, a second metal nitride layer (such as a first one of the plurality of second layers 136B illustrated in FIG. 11) is formed over the first metal nitride layer. The second metal nitride layer is different from the first metal nitride layer. In some embodiments, the first metal nitride layer comprises TiN and the second metal nitride layer comprises TaN. In other embodiments, the first metal nitride layer comprises TaN and the second metal nitride layer comprises TiN. In some embodiments, the steps 1202 and 1204 are performed in a same process chamber. In other embodiments, the steps 1202 and 1204 are performed in different process chambers. In some embodiments, the steps 1202 and 1204 are repeated N1 times. In some embodiments, N1 is between 1 and 50.

FIG. 13 is a flow diagram illustrating the step 1202 of the method 1200 (see FIG. 12) in accordance with some embodiments. In some embodiments, the step 1202 comprises an ALD process and includes performing an ALD cycle 1302 one or more times. In some embodiments, the ALD cycle 1302 is performed N2 times. In some embodiments, N2 is between 1 and 50. In some embodiments, the ALD cycle 1302 is performed at a temperature between about 250° C. and about 550° C. In some embodiments, the ALD cycle 1302 comprises performing a step 1304, where a first metal-containing precursor is introduced over the substrate 102 (see FIG. 10). In some embodiments, the first metal-containing precursor is adsorbed on surfaces exposed by the openings 128N and 128P (see FIG. 10). In some embodiments when the first metal nitride layer comprises TiN, the first metal-containing precursor may comprise TiCl$_4$, tetrakis(dimethylamino)titanium (TDMAT), a combination thereof, or the like. In some embodiments when the first metal nitride layer comprises TaN, the first metal-containing precursor may comprise TaCl$_5$, pentakis(dimethylamino)tantalum (PDMAT), a combination thereof, or the like. In some embodiments, the first metal-containing precursor is introduced for a time between about 0.1 sec and about 20 sec. In some embodiments, a flow rate of the first metal-containing precursor is between about 200 sccm and about 5000 sccm.

In step 1306, un-adsorbed portions of the first metal-containing precursor are purged using a non-reactive gas such as N$_2$, Ar, a combination thereof, or the like. In some embodiments, the purge is performed for a time between 0.1 sec and about 20 sec. In some embodiments, a flow rate of the non-reactive gas may be between about 200 sccm and about 5000 sccm.

In step 1308, a first nitrogen-containing precursor is introduced over adsorbed portions of the first metal-containing precursor. The first nitrogen-containing precursor reacts with adsorbed portions of the first metal-containing precursor and forms the first metal nitride material. In some embodiments when the first metal-containing precursor comprises TiCl$_4$, TaCl$_5$, or PDMAT, the first nitrogen-containing precursor comprises NH$_3$. In some embodiments when the first metal-containing precursor comprises TDMAT, the first nitrogen-containing precursor comprises N$_2$. In some embodiments, the first nitrogen-containing precursor is introduced for a time between 0.1 sec and about 20 sec. In some embodiments, a flow rate of the first nitrogen-containing precursor is between about 200 sccm and about 5000 sccm.

In step 1310, reaction by-products of step 1308 are purged using a non-reactive gas such as N$_2$, Ar, a combination thereof, or the like. In some embodiments, the purge is performed for a time between 0.1 sec and about 20 sec. In some embodiments, a flow rate of the non-reactive gas may be between about 200 sccm and about 5000 sccm.

In some embodiments, a thickness of the first metal-nitride layer can be adjusted by altering the number of cycles N2. In some embodiments, fractions of Ti or Ta in the first metal-nitride layer can be adjusted by tuning the flow rates of the first metal-containing precursor and the first nitrogen-containing precursor.

FIG. 14 is a flow diagram illustrating the step 1204 of the method 1200 (see FIG. 12) in accordance with some embodiments. In some embodiments, the step 1204 comprises an ALD process and includes performing an ALD cycle 1402 one or more times. In some embodiments, the ALD cycle 1402 is performed N3 times. In some embodiments, N3 is between 1 and 50. In some embodiments, the ALD cycle 1402 is performed at a temperature between about 250° C. and about 550° C. In some embodiments, the ALD cycle 1402 comprises performing a step 1404, where a second metal-containing precursor is introduced over the substrate 102. The second metal-containing precursor is different from the first metal-containing precursor. In some embodiments, the second metal-containing precursor is adsorbed on surfaces exposed by the openings 128N and 128P (see FIG. 10). In some embodiments when the second metal nitride layer comprises TiN, the second metal-containing precursor may comprise TiCl$_4$, tetrakis(dimethylamino)titanium (TDMAT), a combination thereof, or the like. In some embodiments when the second metal nitride layer comprises TaN, the second metal-containing precursor may comprise TaCl$_5$, pentakis(dimethylamino)tantalum (PDMAT), a combination thereof, or the like. In some embodiments, the second metal-containing precursor is introduced for a time between about 0.1 sec and about 20 sec. In some embodiments, a flow rate of the second metal-containing precursor is between about 200 sccm and about 5000 sccm.

In step 1406, un-adsorbed portions of the second metal-containing precursor are purged using a non-reactive gas such as N$_2$, Ar, a combination thereof, or the like. In some embodiments, the purge is performed for a time between 0.1 sec and about 20 sec. In some embodiments, a flow rate of the non-reactive gas may be between about 200 sccm and about 5000 sccm.

In step 1408, a second nitrogen-containing precursor is introduced over adsorbed portions of the second metal-containing precursor. The second nitrogen-containing precursor reacts with adsorbed portions of the second metal-containing precursor and forms the second metal-nitride material different from the first metal-nitride material. In some embodiments when the second metal-containing precursor comprises TiCl$_4$, TaCl$_5$, or PDMAT, the second nitrogen-containing precursor comprises NH$_3$. In some embodiments when the second metal-containing precursor comprises TDMAT, the second nitrogen-containing precursor comprises N$_2$. In some embodiments, the second nitrogen-containing precursor is introduced for a time between 0.1 sec and about 20 sec. In some embodiments, a flow rate of the second nitrogen-containing precursor is between about 200 sccm and about 5000 sccm.

In step 1410, reaction by-products of step 1408 are purged using a non-reactive gas such as N$_2$, Ar, a combination thereof, or the like. In some embodiments, the purge is performed for a time between 0.1 sec and about 20 sec. In some embodiments, a flow rate of the non-reactive gas may be between about 200 sccm and about 5000 sccm.

In some embodiments, a thickness of the second-metal nitride layer can be adjusted by altering the number of cycles N3. In some embodiments, fractions of Ti or Ta in the second metal-nitride layer can be adjusted by tuning the flow rates of the second metal-containing precursor and the second nitrogen-containing precursor.

Figure 15:
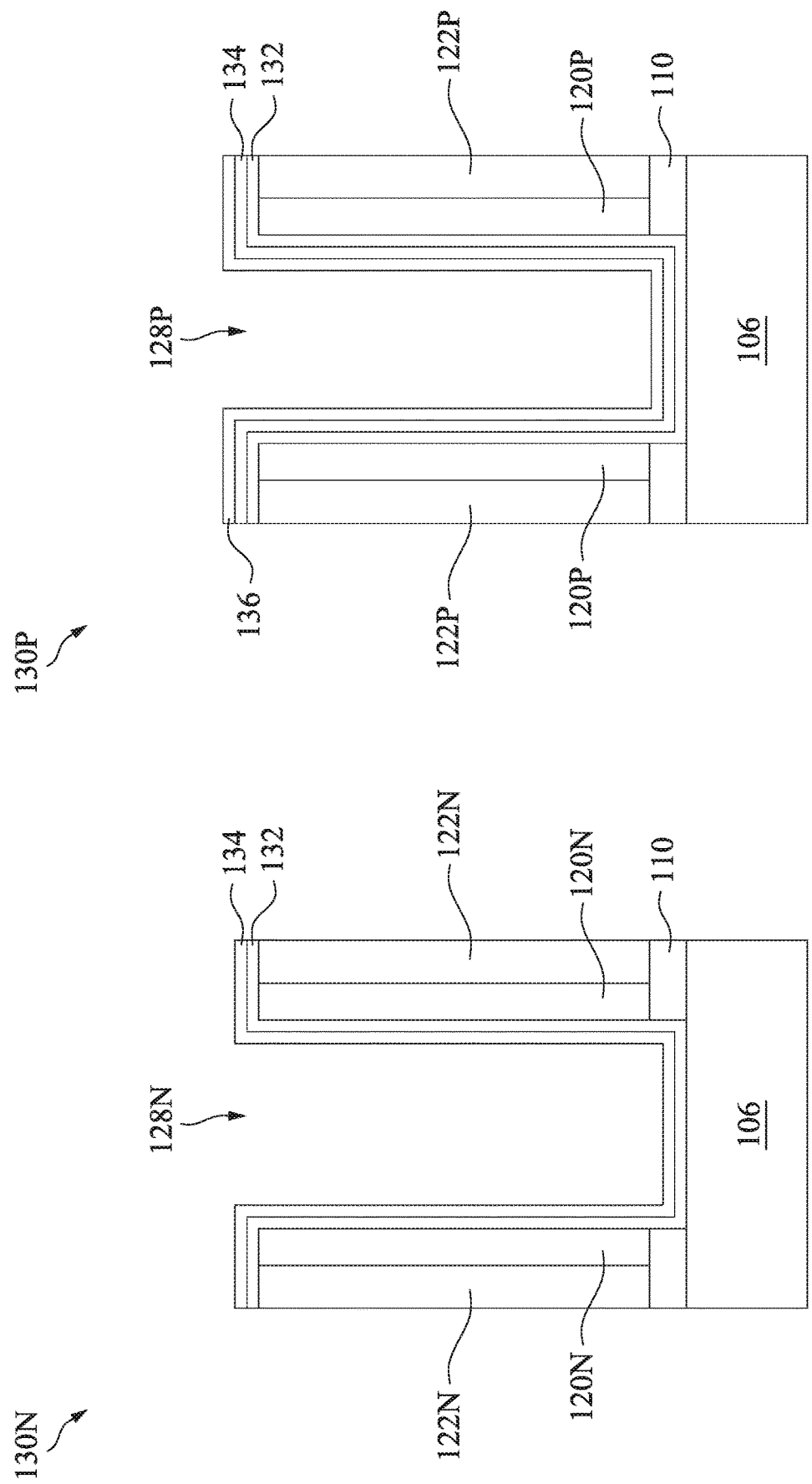

In FIG. 15, after forming the work function layer 136, a first portion of the work function layer 136 is removed from the openings 128N in the region 100N, while a second portion of the work function layer 136 remains in the openings 128P in the region 100P. In some embodiments, a mask such as, for example, a photoresist is formed over the region 100P, while exposing the region 100N. Subsequently, the first portion of the work function layer 136 in the region 100N is removed, for example, by using a suitable etch process. In some embodiments, the suitable etch process is selective to a material of the work function layer 136. In some embodiments, the suitable etch process is performed using etchants, such as HF, a solution comprising H$_2$O, NH$_4$OH, and H$_2$O$_2$, a combination thereof, or the like. After the removal process, the photoresist is removed by an acceptable ashing process followed by a wet clean process, for example.

Figure 16:
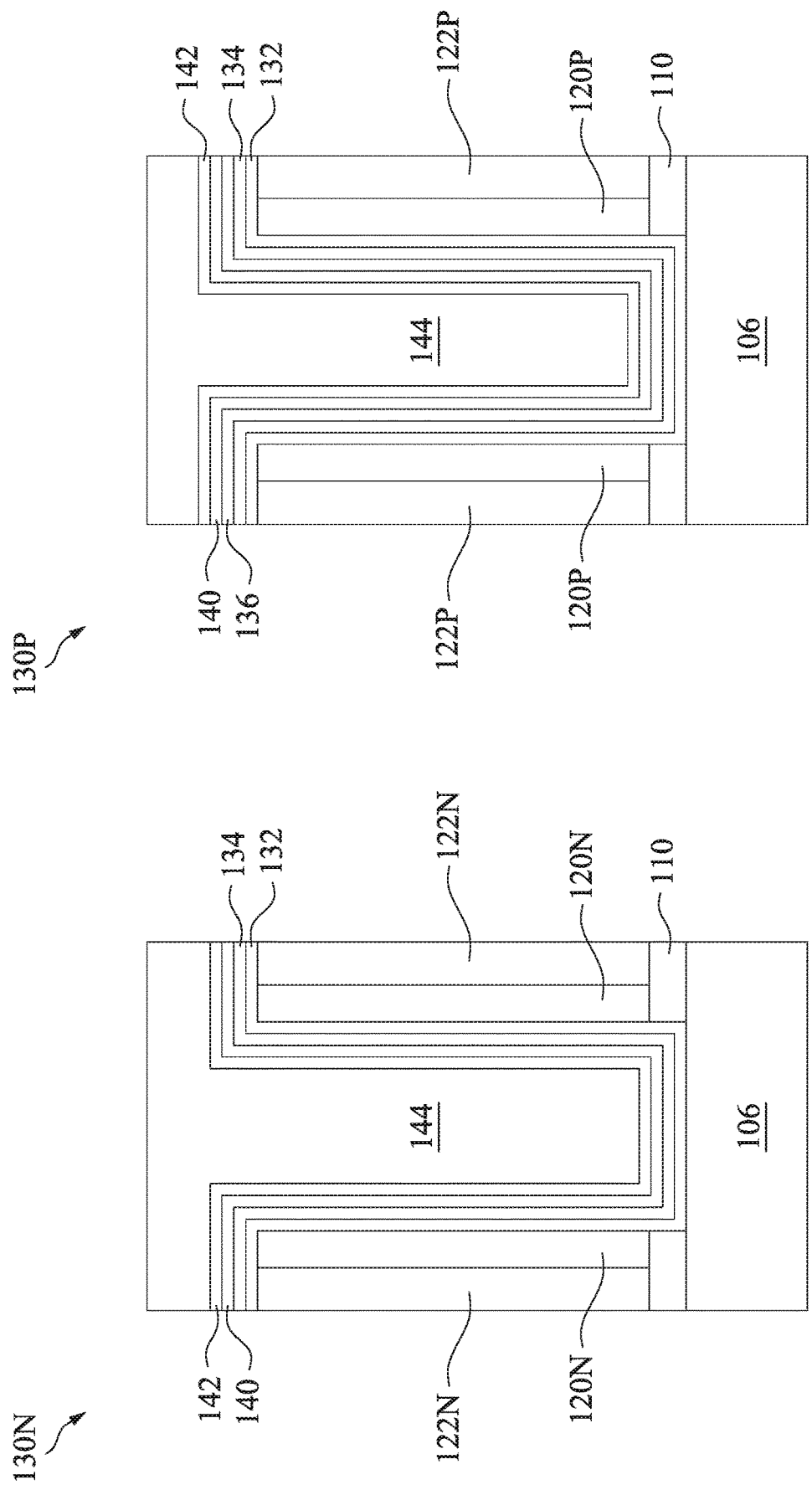

In FIG. 16, a work function layer 140 is formed in the openings 128N and 128P (see FIG. 15). The work function layer 140 may be also referred to as an n-type work function layer. The work function layers 140 may include Ti, Ag, Al, TiAl, TiAlN, TiAlC, TaC, TaCN, TaSiN, TaAlC, Mn, Zr, combinations thereof, multi-layers thereof, or the like, and may be formed using PVD, CVD, ALD, a combination thereof, or the like. In some embodiments, the work function layer 140 has a thickness between about 5 Å and about 50 Å.

After forming the work function layer 140, a glue layer 142 is formed over the work function layer 140 in the openings 128N and 128P (see FIG. 15). The glue layer 142 may include TiN, TaN, TiSiN, TiAlN, combinations thereof, multi-layers thereof, or the like, and may be formed using PVD, CVD, ALD, a combination thereof, or the like. In some embodiments, the glue layer 142 has a thickness between about 10 Å and about 200 Å.

After forming the glue layer 142, a conductive fill layer 144 is formed in the openings 128N and 128P (see FIG. 15). In some embodiments, the conductive fill layer 144 overfills the openings 128N and 128P. In some embodiments, the conductive fill layer 144 may comprise Co, Ru, Al, Ag, Au, W, Ni, Ti, Cu, Mn, Pd, Re, Ir, Pt, Zr, alloys thereof, combinations thereof, multi-layers thereof, or the like, and may be formed using PVD, CVD, ALD, plating, a combination thereof, or the like.

Figure 17:
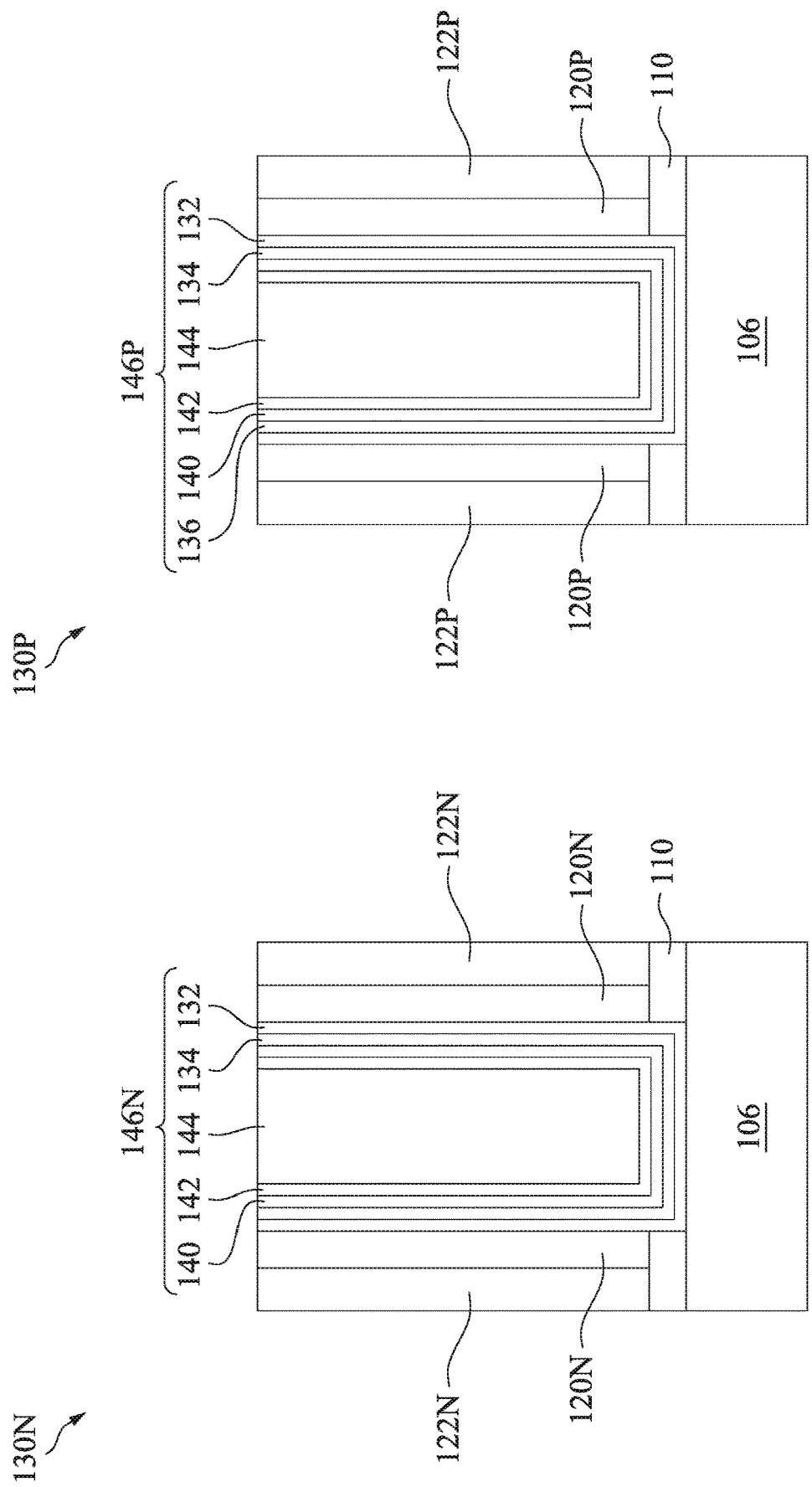

In FIG. 17, after filling of the openings 128N and 128P (see FIG. 15) with the conductive fill layer 144, a planarization process, such as a CMP process, may be performed to remove the excess portions of the interfacial layer 132, the gate dielectric layer 134, the work function layers 136 and 140, the glue layer 142, and the conductive fill layer 144, which excess portions are over the top surface of the ILD 126 (FIG. 9). Remaining portions of the interfacial layer 132, the gate dielectric layer 134, the work function layer 140, the glue layer 142, and the conductive fill layer 144 form gate stacks 146N in the openings 128N in the region 100N (see FIG. 9). Remaining portions of the interfacial layer 132, the gate dielectric layer 134, the work function layers 136 and 140, the glue layer 142, and the conductive fill layer 144 form gate stacks 146P in the openings 128P in the region 100P (see FIG. 9). After the planarization process, top surfaces of the gate stacks 146N and 146P, the top surfaces of the gate seal spacers 120N and 120P, the top surfaces of the gate spacers 122N and 122P, and the top surface of the ILD 126 (see FIG. 9) are substantially co-planar or level with each other within process variations of the planarization process. The gate stacks 146N and 146P may be also referred to as replacement gate stacks.

Figure 18:
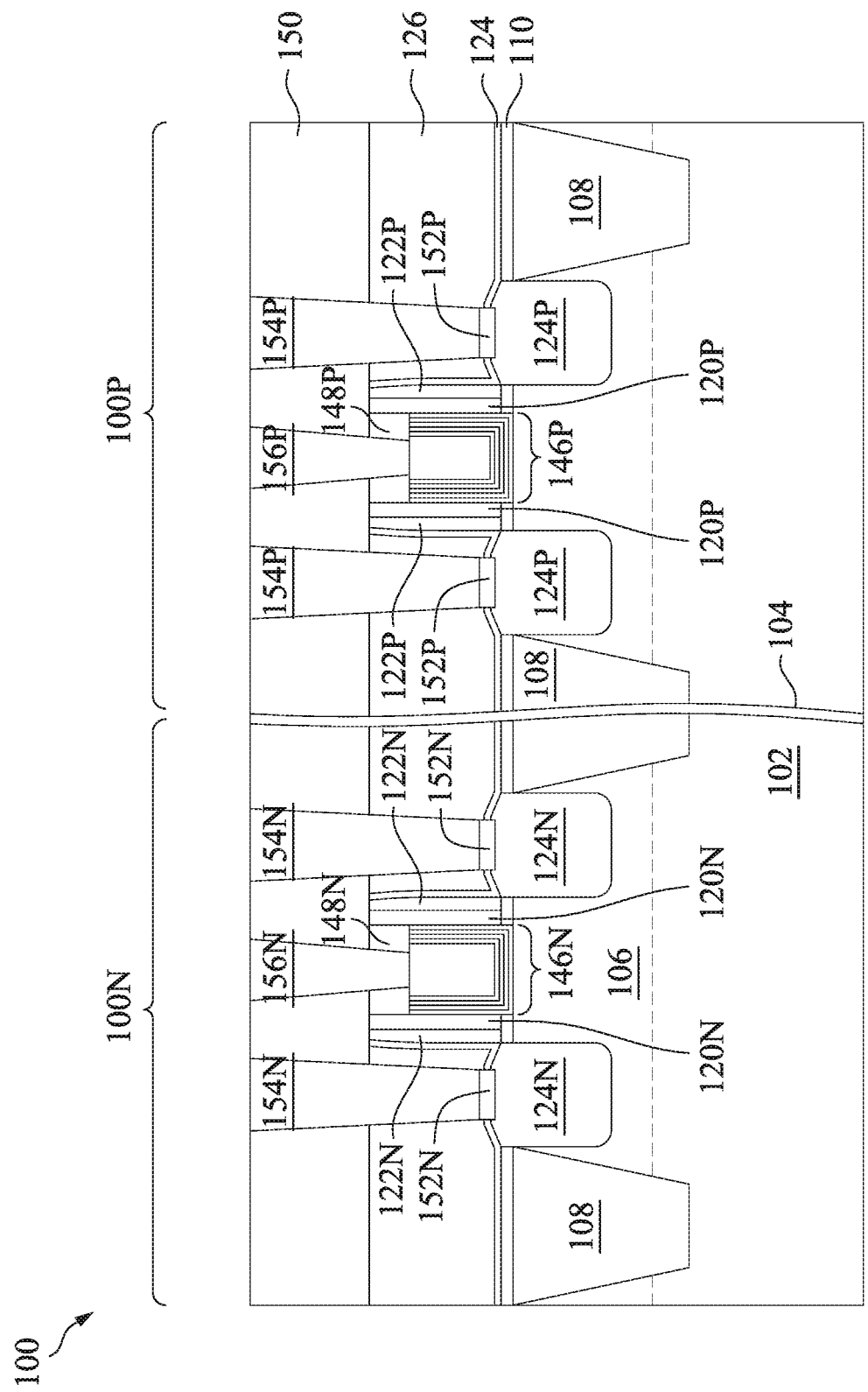

In FIG. 18, after forming the gate stacks 146N and 146P, the gate stacks 146N and 146P are recessed and gate masks 148N and 148P, respectively, are formed in the recesses. The gate masks 148N and 148P may comprise one or more layers of a dielectric material, such as silicon nitride, silicon oxynitride, a combination thereof, or the like, and may be formed using CVD, ALD, a combination thereof, or the like. In some embodiments, materials of the gate masks 148N and 148P are filled in the recesses followed by a planarization process (such as, for example, a CMP process) to remove excess portions of the dielectric material extending over the ILD 126 (FIG. 9). In some embodiments, the gate masks 148N and the gate masks 148P comprise a same material. In other embodiments, the gate masks 148N and the gate masks 148P comprise different materials. After the planarization process, top surfaces of the gate masks 148N and 148P, the top surfaces of the gate seal spacers 120N and 120P, the top surfaces of the gate spacers 122N and 122P, and the top surface of the ILD 126 (see FIG. 9) are substantially co-planar or level with each other within process variations of the planarization process.

After forming the gate masks 148N and 148P, an ILD 150 is deposited over the ILD 126 and the gate masks 148N and 148P. In some embodiments, the ILD 150 is formed using similar materials and methods as the ILD 126 described above with reference to FIG. 7, and the description is not repeated herein. In some embodiments, the ILD 126 and the ILD 150 comprise a same material. In other embodiments, the ILD 126 and the ILD 150 comprise different materials.

Further in FIG. 18, source/drain contacts 154N and gate contacts 156N are formed in the region 100N, and source/drain contacts 154P and gate contacts 156P are formed in the region 100P. Openings for the source/drain contacts 154N and 154P are formed through the CESL 124 and the ILDs 126 and 150. Openings for the gate contacts 156N and 156P are formed through the ILD 150 and the gate masks 148N and 148P, respectively. The openings may be formed using acceptable photolithography and etch techniques.

After forming the openings for the source/drain contacts 154N and 154P, silicide layers 152N and 152P are formed through the openings in the regions 100N and 100P, respectively. In some embodiments, a metallic material is deposited in the openings for the source/drain contacts 154N and 154P. The metallic material may comprise Ti, Co, Ni, NiCo, Pt, NiPt, Ir, PtIr, Er, Yb, Pd, Rh, Nb, a combination thereof, or the like, and may be formed using PVD, sputtering, a combination thereof, or the like. Subsequently, an annealing process is performed to form the silicide layers 152N and 152P. In some embodiments, the annealing process causes the metallic material to react with semiconductor materials of the epitaxial source/drain regions 124N and 124P and form the silicide layers 152N and 152P, respectively. After forming the silicide layers 152N and 152P, unreacted portions of the metallic material are removed using a suitable removal process, such as a suitable etch process, for example.

Subsequently, a liner, such as a diffusion barrier layer, an adhesion layer, or the like, and a conductive material are formed in the openings for the source/drain contacts 154N and 154P, and in the openings for the gate contacts 156N and 156P. The liner may include titanium, titanium nitride, tantalum, tantalum nitride, a combination thereof, or the like. The conductive material may include copper, a copper alloy, silver, gold, tungsten, cobalt, aluminum, nickel, a combination thereof, or the like. A planarization process, such as a CMP process, may be performed to remove excess material from a top surface of the ILD 150. The remaining portions of the liner and the conductive material form the source/drain contacts 154N and 154P, and the gate contacts 156N and 156P in the respective openings. The source/drain contacts 154N and 154P are electrically coupled to the epitaxial source/drain regions 124N and 124P, respectively. The gate contacts 156N and 156P are electrically coupled to the gate stacks 146N and 146P, respectively.

In some embodiments, the source/drain contacts 154N and the gate contacts 156N in the regions 100N comprise a same material as the source/drain contacts 154P and the gate contacts 156P in the regions 100P. In other embodiments, the source/drain contacts 154N and the gate contacts 156N in the regions 100N comprise a different material than the source/drain contacts 154P and the gate contacts 156P in the regions 100P. Although shown as being formed in the same cross-sections, it should be appreciated that each of the source/drain contacts 154N and the gate contacts 156N in the region 100N may be formed in different cross-sections, which may avoid shorting of the contacts. Although shown as being formed in the same cross-sections, it should be appreciated that each of the source/drain contacts 154P and the gate contacts 156P in the regions 100P may be formed in different cross-sections, which may avoid shorting of the contacts.

Embodiments may achieve advantages. Various embodiments discussed herein allow for forming a gate structure comprising a work function layer, a work function of which can be tuned according to design requirements of a semiconductor device. In some embodiments, the work function layer comprises two different metal nitride materials (such as a nitride of a first metal and a nitride a second metal different from the first metal) arranged in a plurality of alternating layers. In some embodiments, the work function of the work function layer may be tuned by adjusting a ratio of a fraction of the first metal to a fraction of the second metal within the work function layer. In some embodiments, a high ratio of the fraction of the first metal to the fraction of the second metal in the work function layer leads to a low work function. In some embodiments, a low ratio of the fraction of the first metal to the fraction of the second metal in the work function layer leads to a high work function.

In accordance with an embodiment, a device includes a gate stack over an active region of a substrate. The gate stack includes a gate dielectric layer and a first work function layer over the gate dielectric layer. The first work function layer includes a plurality of first layers and a plurality of second layers arranged in an alternating manner over the gate dielectric layer. The plurality of first layers include a first material. The plurality of second layers include a second material different from the first material.

Embodiments may include one or more of the following features. The device where the first material is a first metal nitride material. The device where the first metal nitride material includes TaN or TiN. The device where the second material is a second metal nitride material. The device where the second metal nitride material includes TaN or TiN. The device where the gate stack further includes a second work function layer over the first work function layer, the second work function layer including a third material different from the first material and the second material. The device where the first work function layer is a p-type work function layer, and the second work function layer is an n-type work function layer.

In accordance with another embodiment, a device includes a gate stack over an active region of a substrate. The gate stack includes a gate dielectric layer, a p-type work function layer over the gate dielectric layer, and an n-type work function layer over the p-type work function layer. The p-type work function layer includes a pair of layers repeated two of more times. The pair of layers include a first layer including a first metal nitride material and a second layer including a second metal nitride material different from the first metal nitride material.

Embodiments may include one or more of the following features. The device where the first metal nitride material includes TaN or TiN. The device where the second metal nitride material includes TaN or TiN. The device where a ratio of a fraction of Ta to a fraction of Ti in the p-type work function layer is from about 0.5 to about 0.95. The device where the gate stack further includes a glue layer over the n-type work function layer, and a conductive layer over the glue layer. The device where a first thickness of the first layer is different from a second thickness of the second layer.

In accordance with yet another embodiment, a method includes forming a sacrificial gate over an active region of a substrate. The sacrificial gate is removed to form a recess. A replacement gate is formed in the recess. Forming the replacement gate includes forming a gate dielectric layer in the recess, and forming a first work function layer over the gate dielectric layer. Forming the first work function layer includes forming a pair of layers two or more times. The pair of layers includes a first layer including a first metal nitride material and a second layer including a second metal nitride material different from the first metal nitride material.

Embodiments may include one or more of the following features. The method where forming the pair of layers includes performing a first atomic layer deposition (ALD) process to form the first layer, and performing a second ALD process to form the second layer, the second ALD process being different from the first ALD process. The method where the first metal nitride material includes TaN or TiN. The method where the second metal nitride material includes TaN or TiN. The method where forming the replacement gate further includes forming a second work function layer over the first work function layer, a material of the second work function layer being different from the first metal nitride material and the second metal nitride material. The method where forming the replacement gate further includes forming a glue layer over the second work function layer, and filling the recess with a conductive layer. The method where a first thickness of the first layer is same as a second thickness of the second layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a sacrificial gate over an active region of a substrate;
    removing the sacrificial gate to form a recess; and
    forming a replacement gate in the recess, wherein forming the replacement gate comprises:
        forming a gate dielectric layer in the recess; and
        forming a first work function layer over the gate dielectric layer, wherein forming the first work function layer comprises sequentially forming a pair of layers two or more times, each pair of layers comprising a first layer and a second layer, each of the first layers comprising a first metal nitride material, each of the second layers comprising a second metal nitride material different from the first metal nitride material.

2. The method of claim 1, wherein forming the pair of layers comprises:
    performing a first atomic layer deposition (ALD) process to form the first layer; and
    performing a second ALD process to form the second layer, the second ALD process being different from the first ALD process.

3. The method of claim 1, wherein the first metal nitride material comprises TaN or TiN.

4. The method of claim 3, wherein the second metal nitride material comprises TaN or TiN.

5. The method of claim 1, wherein forming the replacement gate further comprises forming a second work function layer over the first work function layer, a material of the second work function layer being different from the first metal nitride material and the second metal nitride material.

6. The method of claim 5, wherein forming the replacement gate further comprises:
    forming a glue layer over the second work function layer; and
    filling the recess with a conductive layer.

7. The method of claim 1, wherein a first thickness of the first layer is same as a second thickness of the second layer.

8. A method of forming a semiconductor device, the method comprising:
    forming a gate stack over an active region of a substrate, wherein forming the gate stack comprises:
        forming a gate dielectric layer; and
        forming a first work function layer over the gate dielectric layer, the first work function layer comprising a plurality of first layers and a plurality of second layers, wherein adjacent first layers of the plurality of first layers are separated by respective second layers of the plurality of second layers, each of the plurality of first layers comprising a first material, each of the plurality of second layers comprising a second material different from the first material.

9. The method of claim 8, wherein the first material is a first metal nitride material.

10. The method of claim 9, wherein the first metal nitride material comprises TaN or TiN.

11. The method of claim 9, wherein the second material is a second metal nitride material.

12. The method of claim 11, wherein the second metal nitride material comprises TaN or TiN.

13. The method of claim 8, wherein forming the gate stack further comprises:
    forming a second work function layer over the first work function layer, the second work function layer comprising a third material different from the first material and the second material.

14. The method of claim 13, wherein the first work function layer is a p-type work function layer, and wherein the second work function layer is an n-type work function layer.

15. A method comprising:
    forming a sacrificial gate over an active region of a substrate;
    forming a dielectric layer along sidewalls of the sacrificial gate;
    removing the sacrificial gate to form a recess;
    forming a gate dielectric layer in the recess;
    forming a first work function layer over the gate dielectric layer, wherein the first work function layer is a p-type layer, and wherein forming the first work function layer comprises:
        forming a first layer of a first metal nitride material over the gate dielectric layer;
        after forming the first layer of the first metal nitride material, forming a first layer of a second metal nitride material over the first layer of the first metal nitride material, the first metal nitride material being a different material than the second metal nitride material;

after forming the first layer of the second metal nitride material, forming a second layer of the first metal nitride material over the first layer of a second metal nitride material;

after forming the second layer of the first metal nitride material, forming a second layer of the second metal nitride material over the second layer of the first metal nitride material; and forming a conductive fill layer over the first work function layer.

16. The method of claim 15, wherein forming the first work function layer further comprises forming one or more pairs of layers, wherein each pair of layers comprises a layer of the first metal nitride material and a layer of the second metal nitride material.

17. The method of claim 15, wherein the first metal nitride material comprises one of TaN or TiN, wherein the second metal nitride material comprises an other one of TaN and TiN.

18. The method of claim 15, wherein forming the first layer of the first metal nitride material comprises a first atomic layer deposition (ALD) process.

19. The method of claim 18, wherein forming the first layer of the second metal nitride material comprises a second ALD process.

20. The method of claim 15, further comprising:
forming a second work function layer over the first work function layer, a material of the second work function layer being different from the first metal nitride material and the second metal nitride material, wherein the second work function layer is an n-type layer.

* * * * *